(12) United States Patent
Reghetti et al.

(10) Patent No.: US 8,773,425 B2
(45) Date of Patent: Jul. 8, 2014

(54) METHODS AND APPARATUSES FOR PROPOSING RESOLUTIONS TO CONFLICTS IN A CAD DRAWING WITH REFLECTIONS

(75) Inventors: Joseph P. Reghetti, Reno, NV (US); Phillip M. Schaeffer, Henderson, NV (US); Shane Hoeft, Centennial, CO (US)

(73) Assignee: M.E.P. CAD Inc., Henderson, NV (US)

( * ) Notice: Subject to any disclaimer, the term of this patent is extended or adjusted under 35 U.S.C. 154(b) by 676 days.

(21) Appl. No.: 12/718,716

(22) Filed: Mar. 5, 2010

(65) Prior Publication Data

US 2010/0223032 A1 Sep. 2, 2010

Related U.S. Application Data

(63) Continuation-in-part of application No. 12/150,845, filed on May 1, 2008, which is a continuation-in-part of application No. 12/150,792, filed on May 1, 2008, now Pat. No. 8,368,717, and a continuation-in-part of application No. 12/150,868, filed on May 1, 2008, now Pat. No. 8,150,660, and a continuation-in-part of application No. 12/150,867, filed on May 1, 2008, now Pat. No. 8,441,502, said application No. 12/150,791 is a continuation-in-part of application No. 12/150,867, filed on May 1, 2008, now Pat. No. 8,441,502, said application No. 12/150,867 is a continuation-in-part of application No. 12/598,418, filed as application No. PCT/US2008/005602 on May 1, 2008, now Pat. No. 8,732,599.

(60) Provisional application No. 60/915,198, filed on May 1, 2007, provisional application No. 61/072,734, filed on Apr. 2, 2008, provisional application No. 60/915,164, filed on May 1, 2007, provisional application No. 60/915,163, filed on May 1, 2007, provisional application No. 60/915,195, filed on May 1, 2007.

(51) Int. Cl.
*G06T 19/00* (2011.01)
*G06T 19/20* (2011.01)

(52) U.S. Cl.
USPC ................ 345/419; 345/619; 382/218; 703/1

(58) Field of Classification Search
CPC ......... G06T 19/00; G06T 17/05; G06T 19/20; G06T 17/50; G06T 17/5086
USPC ......... 345/419–423, 427, 442, 443, 581, 428, 345/619; 703/1; 382/218
See application file for complete search history.

(56) References Cited

U.S. PATENT DOCUMENTS 4,179,751 A 12/1979 Adachi
4,275,449 A 6/1981 Aish
(Continued)

OTHER PUBLICATIONS

M.E.P. Cad, Inc., "Introducing Alarm CAD Manual™," AutoSPRINK, © 1997-2003, 56 pages.
(Continued)

*Primary Examiner* — Kimbinh T Nugyen
(74) *Attorney, Agent, or Firm* — Baker & Hostetler LLP

(57) ABSTRACT

Methods, apparatuses, systems, and software for proposing a resolution to a position conflict between a graphic object within a drawing sharing a portion of, up to all of, the one or more locations of other graphic objects, comprising the steps of: identifying a proposed new location of the graphic object within the drawing that will resolve the conflict; creating a reflection of the graphic object depicting the graphic object as it would appear at the proposed new location without moving the graphic object from its location; and determining whether the proposed new location will clear the conflict by not sharing a portion of the one or more locations, including embodiments directed to the use of reflections, alert/conflict bubbles, modeless drawing windows, and clipping planes.

35 Claims, 22 Drawing Sheets

(56) References Cited

U.S. PATENT DOCUMENTS

| | | | |
|---|---|---|---|
| 4,353,117 A | 10/1982 | Spellmann | |
| 4,427,974 A | 1/1984 | Sheahan | |
| 4,464,719 A | 8/1984 | Spellmann | |
| 4,551,810 A | 11/1985 | Levine | |
| 4,700,317 A | 10/1987 | Watanabe et al. | |
| 4,700,318 A | 10/1987 | Ockman | |
| 4,744,658 A | 5/1988 | Holly | |
| 4,774,658 A | 9/1988 | Lewin | |
| 4,789,944 A | 12/1988 | Wada et al. | |
| 4,811,243 A | 3/1989 | Racine | |
| 4,831,546 A | 5/1989 | Mitsuta et al. | |
| 4,885,694 A | 12/1989 | Pray et al. | |
| 4,964,060 A | 10/1990 | Hartsog | |
| 4,985,855 A | 1/1991 | Aldrich et al. | |
| 4,992,953 A | 2/1991 | Yoshida et al. | |
| 5,021,779 A | 6/1991 | Bisak | |
| 5,021,968 A | 6/1991 | Ferketic | |
| 5,103,214 A | 4/1992 | Curran et al. | |
| 5,109,337 A | 4/1992 | Ferriter et al. | |
| 5,111,392 A | 5/1992 | Malin | |
| 5,139,044 A | 8/1992 | Otten et al. | |
| 5,189,394 A | 2/1993 | Walter et al. | |
| 5,227,983 A | 7/1993 | Cox et al. | |
| 5,255,207 A | 10/1993 | Cornwell | |
| 5,260,883 A | 11/1993 | Wilson | |
| 5,299,307 A | 3/1994 | Young | |
| 5,329,464 A | 7/1994 | Sumic et al. | |
| 5,334,970 A | 8/1994 | Bailey | |
| 5,398,277 A | 3/1995 | Martin | |
| 5,414,408 A | 5/1995 | Berra | |
| 5,517,428 A | 5/1996 | Williams | |
| 5,546,564 A | 8/1996 | Horie | |
| 5,557,537 A | 9/1996 | Normann et al. | |
| 5,561,748 A * | 10/1996 | Niu et al. | 345/420 |
| 5,608,375 A | 3/1997 | Kosick | |
| 5,627,763 A | 5/1997 | Carlson | |
| 5,655,087 A | 8/1997 | Hino et al. | |
| 5,668,736 A | 9/1997 | Douglas et al. | |
| 5,708,798 A | 1/1998 | Lynch et al. | |
| 5,761,674 A | 6/1998 | Ito | |
| 5,808,905 A | 9/1998 | Normann et al. | |
| 5,812,394 A | 9/1998 | Lewis et al. | |
| 5,847,971 A | 12/1998 | Ladner et al. | |
| 5,877,683 A | 3/1999 | Sheasley | |
| 5,877,768 A * | 3/1999 | Jain | 345/421 |
| 5,920,849 A | 7/1999 | Broughton et al. | |
| 5,949,428 A * | 9/1999 | Toelle et al. | 345/589 |
| 5,977,872 A | 11/1999 | Guertin | |
| 5,987,458 A | 11/1999 | Anderson et al. | |
| 6,002,405 A * | 12/1999 | Berroteran | 345/419 |
| 6,064,982 A | 5/2000 | Puri | |
| 6,081,196 A | 6/2000 | Young | |
| 6,141,924 A | 11/2000 | Quaintance | |
| 6,169,550 B1 * | 1/2001 | Jain | 345/421 |
| 6,236,409 B1 | 5/2001 | Hartman | |
| 6,239,708 B1 | 5/2001 | Young | |
| 6,266,396 B1 | 7/2001 | Johnson | |
| 6,272,447 B1 | 8/2001 | Gavin et al. | |
| 6,275,160 B1 | 8/2001 | Ha | |
| 6,304,790 B1 | 10/2001 | Nakamura et al. | |
| 6,331,982 B1 | 12/2001 | Watanabe | |
| 6,333,689 B1 | 12/2001 | Young | |
| 6,333,695 B2 | 12/2001 | Young | |
| 6,446,053 B1 | 9/2002 | Elliott | |
| 6,457,165 B1 | 9/2002 | Isikawa et al. | |
| 6,535,121 B2 | 3/2003 | Matheny | |
| 6,567,772 B1 | 5/2003 | Hoeft | |
| 6,604,126 B2 | 8/2003 | Neiman et al. | |
| 6,636,774 B2 | 10/2003 | Tenma et al. | |
| 6,760,638 B1 | 7/2004 | Love et al. | |
| 6,778,081 B2 | 8/2004 | Matheny | |
| 6,853,299 B2 | 2/2005 | Shiratori et al. | |
| 6,861,951 B2 | 3/2005 | Reghetti et al. | |
| 6,879,941 B1 | 4/2005 | Ehrenberg et al. | |
| 6,970,078 B2 | 11/2005 | Reghetti et al. | |
| 6,992,575 B2 | 1/2006 | Reghetti et al. | |
| 7,042,468 B2 * | 5/2006 | Schwegler et al. | 345/629 |
| 7,046,254 B2 * | 5/2006 | Brown et al. | 345/592 |
| 7,047,168 B2 | 5/2006 | Carballo et al. | |
| 7,047,180 B1 | 5/2006 | Mathews et al. | |
| 7,062,532 B1 | 6/2006 | Sweat et al. | |
| 7,085,697 B1 | 8/2006 | Rappaport et al. | |
| 7,096,163 B2 | 8/2006 | Reghetti | |
| 7,096,165 B2 | 8/2006 | Pantenburg et al. | |
| 7,106,330 B2 | 9/2006 | Liu et al. | |
| 7,161,478 B2 | 1/2007 | Reghetti et al. | |
| 7,176,942 B2 * | 2/2007 | Chartier et al. | 345/619 |
| 7,180,411 B2 | 2/2007 | Reghetti et al. | |
| 2001/0026225 A1 | 10/2001 | Young | |
| 2001/0037190 A1 | 11/2001 | Jung | |
| 2001/0047251 A1 * | 11/2001 | Kemp | 703/1 |
| 2001/0052908 A1 | 12/2001 | Hartman | |
| 2002/0035408 A1 | 3/2002 | Smith | |
| 2002/0035450 A1 * | 3/2002 | Thackston | 703/1 |
| 2002/0178428 A1 | 11/2002 | Horne et al. | |
| 2002/0183982 A1 | 12/2002 | Rauscher | |
| 2003/0074164 A1 | 4/2003 | Simmons et al. | |
| 2003/0135352 A1 * | 7/2003 | Carballo et al. | 703/1 |
| 2004/0073410 A1 | 4/2004 | Maly et al. | |
| 2004/0080520 A1 | 4/2004 | Reghetti et al. | |
| 2005/0102051 A1 | 5/2005 | Okada et al. | |
| 2005/0131619 A1 | 6/2005 | Rappaport et al. | |
| 2006/0044307 A1 * | 3/2006 | Song | 345/419 |
| 2007/0174026 A1 | 7/2007 | Mangon et al. | |
| 2007/0174027 A1 | 7/2007 | Moiseyev | |
| 2007/0179759 A1 | 8/2007 | Mangon | |

OTHER PUBLICATIONS

M.E.P. Cad, Inc., "Alarm CAD Training Manual," AutoSPRINK, © 2006, 137 pages.

M.E.P. Cad, Inc., "AutoSPRINK 2000 Fire Sprinkler Computer Aided Design: Getting Started," AutoSPRINK, © 2000, 38 pages.

M.E.P. Cad, Inc., "AutoSPRINK 2000 Fire Sprinkler Computer Aided Design: Student Workbook 1," AutoSPRINK, © 2000, 86 pages.

M.E.P. Cad, Inc., "AutoSPRINK 2000 Fire Sprinkler Computer Aided Design: Student Workbook 2," AutoSPRINK, © 2000, 112 pages.

M.E.P. Cad, Inc., "AutoSPRINK 2000 Fire Sprinkler Computer Aided Design: User Guide & Tutorial," AutoSPRINK, © 1999, 400 pages.

Gonzalez et al., "VISIR, A Simulation Software for Domotics Installations to Improve Laboratory Training", 31st ASEE/IEEE Frontiers in Education Conference, Session F4C, Oct. 10-13, 2001, Reno, NV.

Muller, Nathan J., "Advanced Drawing Tools Aid Network Planning", International Journal of Network Management, vol. 7, 1997, pp. 324-333.

Ribot et al., "Development Life-Cycle With Reuse", Proceedings of the 1994 ACM Symposium on Applied Computing, pp. 70-76.

Autodesk, "Features and Benefits", Autodesk, Inc. 111 McInnis Parkway, San Rafael, CA 94903, copyright 2004.

Sigma Design, "Learning Guide for Arris Version 8.1", updated Mar. 23, 2004, copyright 2000-2004 Sigma Design.

Sigma Design, "Arris New User Tutorial", First Edition, Version 8.1, updated Jun. 9, 2004, copyright 2004 Sigma Design LLC.

Bentley, "MicroStation", product specification sheet, copyright 2003.

Edgar, J.A., "The Effectiveness of Fire Detection and Fire Sprinkler Systems in the Central Office Enviroment", Telecommunications Energy Conference, 1989, Intelect '89, pp. 21.4/1-21.4/5. (cited in client's patent US 6,567,772 B1 issued May 20, 2003).

Meshkat et al., "Analysis of Safety Systems with On-Demand and Dynamic Failure Modes", 2000 Proceedings, Annual Reliability and Maintainability Symposium, IEEE, pp. 14-21. (cited in client's patent US 6,567,772 B1 issued May 20, 2003).

Wellman et al., "C.M. Sprinkler Systems in Electrical Control Rooms: Cause for Anxiety or Responsible Safety Design?", IEEE Transactions on Industry Applications, vol. 32, No. 1, Jan./Feb. 1996, pp. 25-30. (cited in client's patent US 6,567,772 B1 issued May 20, 2003).

(56) References Cited

OTHER PUBLICATIONS

Meshkat et al., "Dependability Analysis of Systems with On-Demand and Active Failure Modes, Using Dynamic Fault Trees", IEEE Transactions on Reliability, vol. 51, No. 2, Jun. 2002, pp. 240-251. (cited in client's patent US 6,567,772 B1 issued May 20, 2003).

Software Engineering, Inc.; Clients; retrieved on May 16, 2005 from http://www.softwareengineering.com/clients.htm; 2 pages. (cited in client's patent US 7,171,341 B2 issued Jan. 30, 2007).

Sprinkler Design CAD Package, archive of alt.engineering.fire-protection Usenet newsgroup, retrieved from http://groups.google.com on Feb. 3, 2006. (cited in clients patent US 7,171,341 B2 issued Jan. 30, 2007).

Ledermann, "An Authoring Framework for Augmented Reality Presentations", PhD. thesis, Vienna University of Technology, published May 12, 2004, http://www.ims.tuwien.ac.at/media/documents/publications/ledermann_thesis.pdf (cited by international search report in regards to pending application PCT/US 08/05593.

Mepcad, Inc., "New AutoSPRINK Features," AutoSPRINK 2000, Oct. 1, 1999, USA.

Mepcad, Inc., "AutoSPRINK VR: Student Workbook," AutoSPRINK VR (VR3), 2002, USA.

Mepcad, Inc., "AutoSPRINK VR: New Features Since AutoSPRINK 2000 Release," AutoSPRINK VR (VR3), Jul. 2002, USA.

Mepcad, Inc., "AutoSPRINK VR: Student Workbook," AutoSPRINK VR4, 2004, USA.

Mepcad, Inc., "AutoSPRINK VR4 New Features List—Version 4.0," AutoSPRINK VR4, Jun. 21, 2004, USA.

Mepcad, Inc., "AutoSPRINK VR5 New Features List—Version 5.0," AutoSPRINK VR5, Sep. 28, 2005, USA.

Mepcad, Inc., "AutoSPRINK VR: Student Workbook," AutoSPRINK VR5, 2005, USA.

AutoSPRINK VR Cad Program Features, Jul. 2005, 32 pages.

* cited by examiner

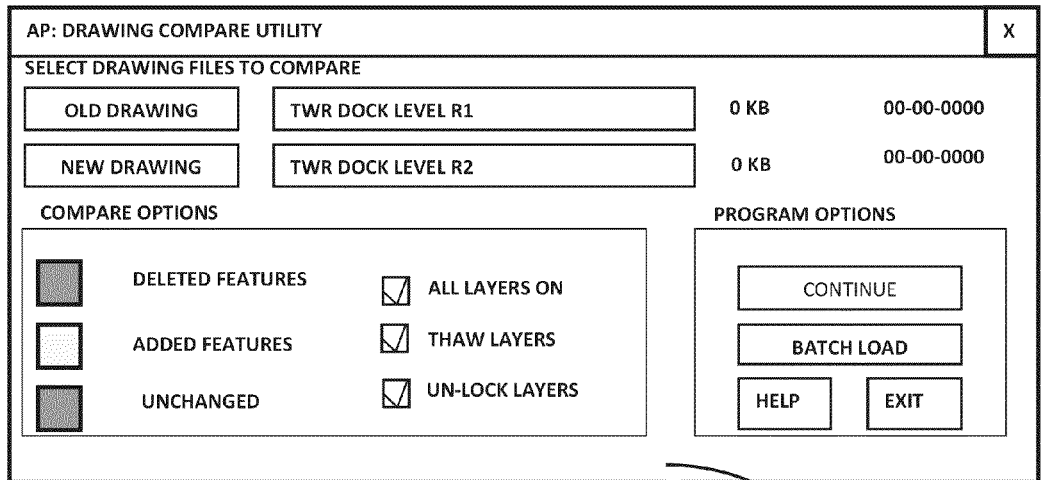
FIG. 12a — 157
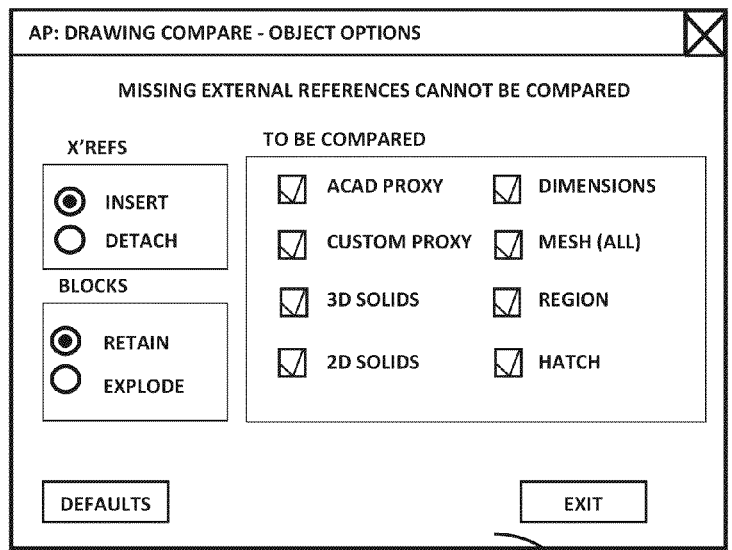
FIG. 12b — 158

| ALERT CONTROL | | | | | - ☐ X |
|---|---|---|---|---|---|
| ALERT CONTROL | DISPLAY OPTIONS | ARM AROUND | JOB | TARGETING | |

CHOOSE OPTIONS TO BE APPLIED TO THE ALERT.
UTILIZE THE TRADES CONFIGURATION TO BE USER WITH ALERT NOTE'S ASSIGNMENT NOTE TYPE.
UTILIZE EXPORT OPTIONS TO CHOOSE INFORMATION ABOUT THE SELECTED ALERTS TO BE EXPORTED TO A .DWG FILE.

ALERT BUBBLE ASSIGNMENT

- ⦿ BUBBLE :: RADIUS  1-0
- ○ POINT

SECONDARY LOCATION  11-4, 84-7 1/2, 9

☐ APPLY SETTINGS TO ALERTS

☑ SHOW LABEL
☑ *LABEL INCLUDES LOCATION
☑ SHOW DIMENSION LINES
☐ MAKE LABELS FLAT TO VIEW

☐ SHOW TOP OF STRUCTURE DIMENSION LINES
☐ SHOW TOP OF STRUCTURE LABEL
☐ SHOW FINISH FLOOR DIMENSION LINES
☐ SHOW FINISH FLOOR LABEL
☑ SHOW HORIZONTAL DIMENSION LINES
☑ PUSH OUT HORIZONTAL DIMENSION LINES

*LOCATION IS THE FIRST LOCATION NOTE OR THE 3D LOCATION OF THE ALERT IF NONE EXISTS

TRADES CONFIGURATION

| NUMBER | TRADE | COLOR | NAME | PRIORITY |
|---|---|---|---|---|
| 0 | STEEL | | | |
| 1 | HVAC | | | |
| 2 | PLUMBING | | | |
| 3 | ELECTRICAL | | | |
| 4 | FIRE SPRINKLER | | | |
| 5 | OTHER | | | |

| ADD TRADE | DELETE TRADE |
|---|---|

EXPORT OPTIONS

⦿ BUBBLE  ○ POINT      ☑ COLOR BY TRADE      ☐ DATE   04/19/08. 18:07:05

NOTES         DIMENSIONS         TAG
☐ GENERAL                              ☑ EXPORT TAG                RESOLUTION LOGS
☑ RESOLUTION     ☐ TOP OF STEEL
☑ LOCATION       ☐ FINISH FLOOR
☑ ASSIGNMENT     ☑ HORIZONTAL

ALERT LABELS                          ALERT BUBBLES
⦿ ALERT  ○ RESOLUTION  ○ BOTH        ⦿ ALERT  ○ RESOLUTION  ○ BOTH

| SELECT ALL ALERTS | EXPORT TO AUTOCAD .DWG |
|---|---|

| APPLY | CLOSE | HELP |
|---|---|---|

332        FIG. 16        330  334

METHODS AND APPARATUSES FOR PROPOSING RESOLUTIONS TO CONFLICTS IN A CAD DRAWING WITH REFLECTIONS

CROSS-REFERENCES TO RELATED APPLICATIONS

This application: (i) claims priority from U.S. Provisional Appl. No. 61/157,460, filed Mar. 4, 2009; (ii) is a continuation-in-part of U.S. application Ser. No. 12/150,845, filed May 1, 2008; (iii) is a continuation-in-part of U.S. application Ser. No. 12/150,792 filed May 1, 2008, which claims priority from U.S. Provisional Application No. 60/915,198, filed May 1, 2007; (iv) is a continuation-in-part of U.S. application Ser. No. 12/150,868, filed May 1, 2008, which claims priority from both U.S. Provisional Application No. 61/072,734, filed Apr. 2, 2008, and U.S. Provisional Application No. 60/915, 206, filed May 1, 2007; (v) is a continuation-in-part of U.S. application Ser. No. No. 12/150,791, filed May 1, 2008, which claims priority from both U.S. Provisional Application No. 61/072,734, filed Apr. 2, 2008, and U.S. Provisional Application No. 60/915,164, filed May 1, 2007; (vi) is a continuation-in-part of U.S. application Ser. No. 12/150,867, filed May 1, 2008, which claims priority from both U.S. Provisional Application No. 61/072,734, filed Apr. 2, 2008, and U.S. Provisional Application No. 60/915,163, filed May 1, 2007; and (vii) is a continuation-in-part of U.S. application Ser. No. No. 12/598,418, filed Oct. 30, 2009, which is a U.S. national stage application under 35 U.S.C. §371 of International Application No. PCT/US08/05602, filed May 1, 2008, which claims benefit of priority from U.S. Provisional Application No. 60/915,195, filed May 1, 2007, each of which is hereby incorporated herein by reference in its entirety to be considered part of this specification.

BRIEF DESCRIPTION OF THE INVENTION

The present invention is directed to methods, apparatuses, systems, and software for proposing a resolution to a conflict between a graphic object within a drawing sharing a portion of, up to all of, the one or more locations of other graphic objects, comprising the steps of: identifying a proposed new location of the graphic object within the drawing that will resolve the conflict; creating a reflection of the graphic object depicting the graphic object as it would appear at the proposed new location without moving the graphic object from its location; and determining whether the proposed new location will clear the conflict by not sharing a portion of the one or more locations, including embodiments directed to the use of reflections, alert/conflict bubbles, modeless drawing windows, and clipping planes.

An embodiment includes a method of proposing a resolution to a conflict between a first three-dimensional graphic object having a first location within a drawing and one or more other three-dimensional graphic objects having one or more second locations within the drawing, the conflict resulting from the first location sharing a portion of, up to all of, the one or more second locations, comprising the steps of: identifying a proposed new location of the first three-dimensional graphic object within the drawing that will resolve the conflict; creating a reflection of the first three-dimensional graphic object depicting the first three-dimensional graphic object as it would appear at the proposed new location without moving the first three-dimensional graphic object from the first location; and determining whether the proposed new location will clear the conflict by not sharing a portion of the one or more second locations.

An aspect of the embodiment is where the reflection is an exact, translucent depiction of at least the first three-dimensional graphic object.

An aspect of the embodiment is where the reflection is an altered, translucent depiction of at least the first three-dimensional graphic object.

An aspect of the embodiment is where the altered, translucent depiction provides a modified dimension or shape compared to an original dimension or shape of at least the first three-dimensional graphic object, and where the proposed new location is based on the modified dimension or shape.

An aspect of the embodiment further comprises the steps of: creating a three-dimensional resolution graphic object at a conflict location in the drawing, the conflict location being near where the first location shares the portion of, up to all of, the one or more second locations; and deleting the three-dimensional resolution graphic object when the proposed new location is determined not to share a portion of the one or more second locations.

An aspect of the embodiment further comprises the steps of: creating a three-dimensional resolution graphic object at a conflict location in the drawing, the conflict location being near where the first location shares the portion of, up to all of, the one or more second locations, where the three-dimensional resolution graphic object is a translucent bubble having a first color; moving the three-dimensional resolution graphic object from the conflict location to a non-conflict location near the proposed new location when the proposed new location is determined to clear the conflict; and changing the first color of the translucent bubble to a second color.

An aspect of the embodiment further comprises the steps of: creating a three-dimensional resolution graphic object at a conflict location in the drawing, the conflict location being near where the first location shares the portion of, up to all of, the one or more second locations, wherein the three-dimensional resolution graphic object is a translucent bubble having a first color; and changing the first color of the translucent bubble to a second color if the proposed new location is determined to clear the conflict.

An aspect of the embodiment is where the step of identifying a proposed new location includes the step of receiving from a user one or more objective distances for moving the first three-dimensional graphic object from the first location to the new location.

An aspect of the embodiment is where the one or more objective distances include a first distance to resolve the conflict and a first additional distance along a first axis, a second distance to resolve the conflict and a second additional distance along a second axis, and a third distance to resolve the conflict and a third additional distance along a third axis, wherein the step of receiving includes the step of displaying to the user a targeting screen including a movement controller and a targeting diagram, the movement controller providing the user with manual inputs for setting the first distance, the first additional distance, the second distance, the second additional distance, the third distance and the third additional distance, the targeting diagram providing a visual illustration of the manual inputs along the first axis, the second axis and the third axis.

An aspect of the embodiment further comprises the step of displaying an alert bubble at the proposed new location that indicates the one or more objective distances.

An aspect of the embodiment is where the first three dimensional graphic object has a conflict location in the drawing near where the first location shares the portion of, up to all of, the one or more second locations, further comprising the step of displaying a line from the conflict location to the alert bubble.

An aspect of the embodiment further comprises the step of providing a modeless drawing window that depicts an exact replica of an area around the conflict, wherein the area around the conflict depicted within the modeless drawing can be viewed and moved by a user within the modeless drawing window independent of a remainder of the drawing.

An aspect of the embodiment is where the user can change a magnification of the area around the conflict depicted within the modeless drawing window independent of the remainder of the drawing.

An aspect of the embodiment is where the step of identifying a proposed new location includes the step of receiving from a user one or more objective distances for moving the first three-dimensional graphic object from the first location to the new location, and wherein the one or more objective distances include a first distance to resolve the conflict and a first additional distance along a first axis, a second distance to resolve the conflict and a second additional distance along a second axis, and a third distance to resolve the conflict and a third additional distance along a third axis, wherein the step of receiving includes the step of displaying to the user a targeting screen including a movement controller and a targeting diagram, the movement controller providing the user with manual inputs for setting the first distance, the first additional distance, the second distance, the second additional distance, the third distance and the third additional distance, the targeting diagram providing a visual illustration of the manual inputs along the first axis, the second axis and the third axis.

An aspect of the embodiment further comprises the step of providing a modeless drawing that represents at least a portion of an area surrounding the first three-dimensional graphic object and the one or more three-dimensional graphic objects, wherein the modeless drawing can be viewed from one or more angles and at one or more magnifications.

An aspect of the embodiment further comprises the step of moving a representation of at least the first three-dimensional graphic object depicted within the modeless drawing from the first location to the proposed new location according to one or more objective distances along one or more axes provided by a user.

An aspect of the embodiment is where the drawing includes a plurality of three-dimensional graphic objects, further comprising the step of providing a clipping plane that allows a user to select a bounded area within the drawing to view and edit one or more three-dimensional graphic objects among the plurality of three-dimensional graphic objects within the bounded area, wherein only the one or more three-dimensional graphic objects visible within the bounded area can be edited by the user and no edit made within the bounded area affects any three-dimensional graphic objects among the plurality of three-dimensional graphic objects not visible within the bounded area.

An aspect of the embodiment further comprises the steps of: selecting a point of interest within the drawing; placing the bounded area around the point of interest; contracting and expanding the bounded area around the point of interest until the bounded area contains only a set of one or more three-dimensional graphic objects among the plurality of three-dimensional graphic objects that the user wants to edit; and editing the set of one or more three-dimensional graphic objects.

An aspect of the embodiment is where the step of contracting and expanding includes the step of providing the user with a click on and drag slider.

An aspect of the embodiment is where the step of placing includes the step of centering the bounded area on the point of interest.

An aspect of the embodiment further comprises the step of centering the drawing visible to the user on the point of interest.

An aspect of the embodiment further comprises the step of locking a position of the point of interest.

An aspect of the embodiment is where the step of identifying a proposed new location includes the steps of providing one or more remote users with access to the drawing and permitting the one or more remote users to collaboratively determine the proposed new location.

An aspect of the embodiment is where the step of identifying a proposed new location further includes the step of receiving one or more objective distances provided by the one or more remote users and using the one or more objective distances to determine the proposed new location, and wherein the one or more objective distances include a first distance to resolve the conflict and a first additional distance along a first axis, a second distance to resolve the conflict and a second additional distance along a second axis, and a third distance to resolve the conflict and a third additional distance along a third axis, wherein the step of receiving includes the step of displaying to the one or more remote users a targeting screen including a movement controller and a targeting diagram, the movement controller providing the one or more remote users with manual inputs for setting the first distance, the first additional distance, the second distance, the second additional distance, the third distance and the third additional distance, the targeting diagram providing a visual illustration of the manual inputs along the first axis, the second axis and the third axis.

An embodiment includes a method of proposing a resolution to a position conflict between a first three-dimensional graphic object and a second three-dimensional graphic object within a drawing, comprising the steps of: identifying a set of coordinates for a proposed new location of either the first three-dimensional graphic object or the second three-dimensional graphic object that will resolve the position conflict, including the steps of receiving one or more objective distances provided by a user and using the one or more objective distances to determine the proposed new location; and creating a replica of either the first three-dimensional graphic object or the second three-dimensional graphic object in the drawing that illustrates how the first three-dimensional graphic object or the second three-dimensional graphic object will look if moved to the proposed new location.

An aspect of the embodiment further comprises the steps of: creating an alert bubble within the drawing near an area of the position conflict; and associating a label with the alert bubble indicating the one or more objective distances.

An aspect of the embodiment further comprises the step of creating a line in the drawing from the position conflict to the alert bubble.

An aspect of the embodiment is where the one or more objective distances include a first distance to resolve the conflict and a first additional distance along a first axis, a second distance to resolve the conflict and a second additional distance along a second axis, and a third distance to resolve the conflict and a third additional distance along a third axis, wherein the step of receiving includes the step of displaying to the user a targeting screen including a movement controller and a targeting diagram, the movement controller providing the user with manual inputs for setting the first distance, the first additional distance, the second distance, the second additional distance, the third distance and the third additional distance, the targeting diagram providing a visual illustration of the manual inputs along the first axis, the second axis and the third axis.

An aspect of the embodiment further comprises the step of providing a modeless drawing window that depicts an exact replica of an area around the position conflict, wherein the area around the position conflict depicted within the modeless drawing can be viewed and moved by the user within the modeless drawing window independent of a remainder of the drawing.

An aspect of the embodiment is where the user can change a magnification of the area around the position conflict depicted within the modeless drawing window independent of the remainder of the drawing.

An aspect of the embodiment is where the modeless drawing includes at least a portion of the first three-dimensional graphic object and at least a portion of the second three-dimensional graphic object, and wherein the first three-dimensional graphic object or second three-dimensional graphic object depicted in the modeless drawing window is moved based on the one or more objective distances to illustrate how the first three-dimensional graphic object or the second three-dimensional graphic object would appear in the proposed new location.

An embodiment includes a method of proposing a resolution to a position conflict between a first three-dimensional graphic object and a second three-dimensional graphic object within a drawing, comprising the steps of: identifying a set of coordinates for a proposed new location of either the first three-dimensional graphic object or the second three-dimensional graphic object that will resolve the position conflict, including the steps of receiving one or more objective values provided by a user and necessary to resolve the position conflict and using the one or more objective values to determine the proposed new location; providing a modeless drawing that represents an area around the position conflict and includes at least a portion of the first three-dimensional graphic object and at least a portion of the second three-dimensional graphic object, wherein the modeless drawing can be viewed from one or more angles and at one or more magnifications; and creating and displaying a replica of either the first three-dimensional graphic object or the second three-dimensional graphic object in the modeless drawing that illustrates how the first three-dimensional graphic object or the second three-dimensional graphic object will look if moved to the proposed new location.

An aspect of the embodiment further comprises the step of moving the first three-dimensional graphic object depicted within the modeless drawing from an existing location to the proposed new location according to one or more objective values.

An embodiment includes a method of proposing a resolution to a position conflict between a first three-dimensional graphic object and a second three-dimensional graphic object within a drawing, comprising the steps of: identifying a set of coordinates for a proposed new location of either the first three-dimensional graphic object or the second three-dimensional graphic object that will resolve the conflict, including the steps of receiving one or more objective values provided by a user and using the one or more objective values to determine the proposed new location; providing a clipping plane that allows the user to select a bounded area within the drawing to view an area of the drawing around the position conflict without editing any graphic object in the drawing not depicted within the area; and creating and displaying a replica of either the first three-dimensional graphic object or the second three-dimensional graphic object in a modeless drawing that illustrates how the first three-dimensional graphic object or the second three-dimensional graphic object will look if moved to the proposed new location.

An aspect of the embodiment further comprises the steps of: selecting a point of interest within the area; placing and centering the bounded area on and around the point of interest; contracting and expanding the bounded area around the point of interest in response to a user initiated movement of a slider displayed to the user until the bounded area contains only one or more desired graphic objects that the user wants to edit; and editing the one or more desired objects.

STATEMENT AS TO THE RIGHTS TO INVENTIONS MADE UNDER FEDERALLY SPONSORED RESEARCH OR DEVELOPMENT

Not Applicable.

REFERENCE TO A "SEQUENCE LISTING," A TABLE, OR A COMPUTER PROGRAM LISTING APPENDIX SUBMITTED ON A COMPACT DISK

Not Applicable.

BACKGROUND OF THE INVENTION

Embodiments of the invention are directed to computer aided design (CAD) and, in particular, to systems and methods for managing the processing of multiple CAD drawings. CAD software is often used by designers, architects, engineers and the like to prepare a two-dimensional (2D) CAD drawing or three-dimensional (3D) model or models representing different physical objects, such as a mechanical device, a bridge, a building, an automobile, and airplane, etc. The more complicated the object being illustrated, the more complicated the drawings illustrating that object. For example, with respect to a building, the drawing will include the structural components of the building, including the beams, columns, walls, floors, windows, doors, etc. (the "frame"), as well as the HVAC, plumbing, electrical, fire sprinkler, and other components.

Most CAD designs are generated as a result of collaborative and iterative processes. For example, with respect to a building design, after the frame is designed by the architects and structural engineers to create a base CAD drawing of the building structure, that base drawing is then sent to other designers or subcontractors to add their components to the design, including HVAC ducting, plumbing layouts, electrical chases, fire sprinkler lines, etc. The same process is generally followed for civil engineering or with more complicated designs of other objects, such as tool making, automobile and airplanes designs, etc.

During the design process, the various designers have multiple options for creating CAD designs for their specific portions of the project. In the simplest case, all the designers can utilize the same CAD program used to create the base drawing. However, in many instances, the designers utilize different third-party programs that are specific to their particular field, which requires data to be exported from the base drawing to the third party program so the design can be created using the third-party program and then the new data is imported from the third-party program back into the base drawing.

Alternatively, a stand-alone product with its own 3D intelligent design engine, such as AutoSPRINK® by M.E.P.CAD, Inc. (assignee of the present invention), could be used to both create the base drawings and to add subcontract designs, such as fire sprinkler systems. Such programs are typically able to run on widely available personal computers running popular operating systems like Microsoft® Windows®. Programs such as AutoSPRINK are also capable of importing or exporting different types of CAD files.

With multiple designers participating in the design and review processes on various versions of the CAD drawings for a particular object, a number of problems can arise with respect to managing modifications, identifying and/or resolving conflicts, the reconciliation of 2D and 3D drawings, coordinating associations between related drawings and the like. For example, in the process of adding M.E.P. trade ("mechanical, electrical, plumbing" and other trade) designs to a base building or structural drawing, or revising a drawing in some other way, it is common for conflicts to arise between different objects within that drawing (e.g., objects that share the same physical space). Moreover, oftentimes when one object is moved to address a particular conflict, another conflict may be created.

Furthermore, to expedite the design of subcontracted components for a particular project, different subcontractors often work on their modifications to a building design in parallel with one another. These parallel modified CAD drawings are then combined to create a complete design. While faster in some ways, this parallel process can create conflict problems, especially for large drawings. Furthermore, even though a subcontractor may only be responsible for a handful of conflicts, that subcontractor would typically be sent the entire drawing with all the different subcontractor conflicts along with a video and/or a conflict report, and be expected to find their conflicts and resolve them. As a result, a first conflict resolution meeting or design review will often be followed by several additional conflict resolution meetings as the correction of one set of conflicts can generate other problems. Hence, extensive time and resources are often expended to identify and correct conflicts with CAD drawings.

BRIEF DESCRIPTION OF THE SEVERAL VIEWS OF THE DRAWING

FIGS. 12a and 12b are illustrations of a compare utility and comparison options in accordance with the present invention;

FIG. 16 is an illustration of the display and export options for the alert bubbles of FIG. 15;

DETAILED DESCRIPTION OF THE INVENTION

Figure 1:
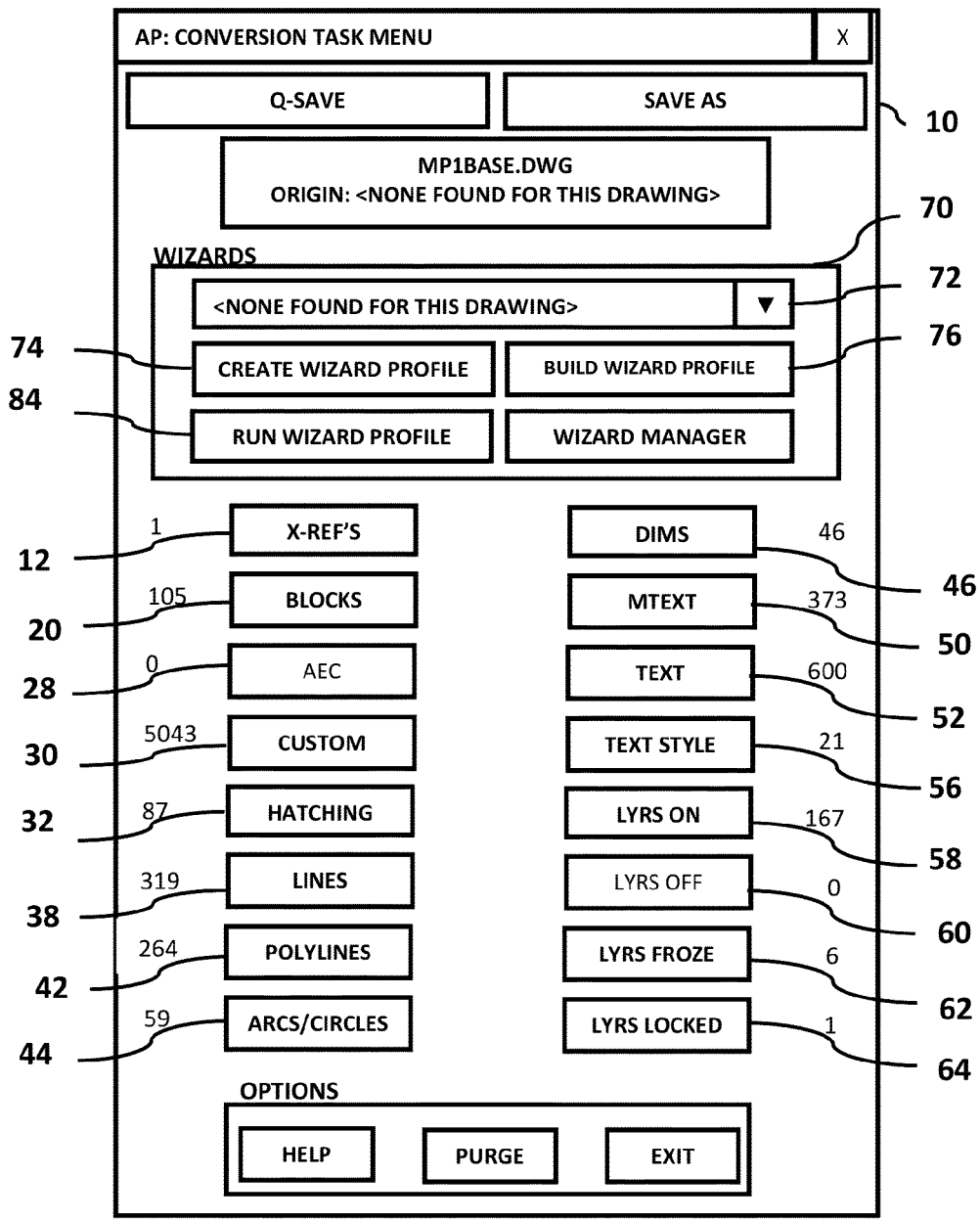
FIG. 1 is an illustration of a main dialog box for a clean-up utility in accordance with the present invention.

The present invention is directed to methods, apparatuses/systems, and software for proposing a resolution to a conflict between a graphic object within a drawing sharing a portion of, up to all of, the one or more locations of other graphic objects, comprising the steps of: identifying a proposed new location of the graphic object within the drawing that will resolve the conflict; creating a reflection of the graphic object depicting the graphic object as it would appear at the proposed new location without moving the graphic object from its location; and determining whether the proposed new location will clear the conflict by not sharing a portion of the one or more locations, including embodiments directed to the use of reflections, alert/conflict bubbles, modeless drawing windows, and clipping planes.

The features of the systems and methods will now be described with reference to the drawings summarized above. Throughout the drawings, reference numbers are re-used to indicate correspondence between referenced elements. The drawings, associated descriptions, and specific implementation are provided to illustrate embodiments of the invention and not to limit the scope of the disclosure.

In addition, methods and functions described herein are not limited to any particular sequence, and the blocks or states relating thereto can be performed in other sequences that are appropriate. For example, described blocks or states may be performed in an order other than that specifically disclosed, or multiple blocks or states may be combined into a single block or state.

Where this specification refers to the system's characteristics described herein, note that the same description applies to related methods, apparatus, and computer programs. In its presently preferred embodiment, the invention is a software program written in AutoLISP (although it could readily be written in VisualBasic and/or C++) that operates in a standalone fashion or in conjunction with the AutoCAD platform by Autodesk, Inc. on any appropriate computer system. The present invention is not limited to the AutoCAD platform and could be utilized in conjunction with any CAD program, such as, for example, REVIT, VISIO, MICROSTATION, ARCHICAD, BRICSNET, TURBOCAD, INTELLICAD, CATIA or the like. As utilized in conjunction with AutoCAD, once installed, the present invention would be incorporated into the standard menu bar for the AutoCAD program, so that it was readily accessible within the AutoCAD system.

Furthermore, the present invention is not limited to any particular type of design project. Although the preferred embodiment of the invention is described in the context of building design projects, the present invention is not limited to use in building design and could be used with any design of any object on any CAD system or third party add-on product associated with a CAD system, such as, for example, roads, bridges, buildings, automobiles, aircraft, combinations of the same or the like, and/or with other CAD media, such as art, science, graphics combinations of the same or the like.

The term "object" as used herein is a broad term and is used in its ordinary sense and refers to, without limitation, a fundamental unit for creating a CAD drawing. For instance, objects can comprise graphic objects, such as a line, arc, circle, any 2D or 3D entity, text, combinations of the same or the like. Objects can also comprise non-graphic objects, such as attributes, building information modeling (BIM) data, metadata, extensions, combinations of the same or the like.

The term "block" as used herein is a broad term and is used in its ordinary sense and refers to, without limitation, any internal database assembly and/or collection of one or more graphic objects and/or non-graphic objects.

The term "drawing" as used herein with respect to CAD drawings is a broad term and is used in its ordinary sense and refers to, without limitation, any collection of one or more blocks that make up at least a portion of a design of a structure, article, vehicle, item, combinations of the same or the like.

The term "external reference," or "X-ref," as used herein is a broad term and is used in its ordinary sense and refers to, without limitation, a file, drawing, design or other data structure that comprises an assembly of one or more objects referenced by another drawing. For example, an X-ref may not be directly accessible or editable to the user of the referencing (e.g., host) CAD drawing until the X-ref is inserted or bound into the drawing (e.g., thereby becoming a block of the CAD drawing).

The term "entity" as used herein is a broad term and is used in its ordinary sense and refers to, without limitation, any drawing, block, object or other distinct, individual unit usable in CAD design.

Most engineers and designers have experienced the problems associated with opening and working with complex drawings. Designers and engineers often develop a drawing project with a main drawing and a large number of subordinate or support drawings, referred to as X-Ref's or external or cross-reference drawings. Before work can be performed on the main drawing these X-Ref's may have to be integrated or bound to the main drawing. Unfortunately, binding all of the X-Ref's can have the effect of cluttering the main drawing with all kinds of excess or unimportant elements and layers. The users are then burdened with hours of "clean-up" work to trim the main drawing down by binding necessary X-Ref's, integrating layers and removing unnecessary information.

In order to improve a designer's ability to work with a CAD drawing, such as the main CAD drawing of a large building, or to export/import that drawing to and from a program like AutoSPRINK, it is first necessary to clean-up the CAD drawing in a way that will reduce the complexity of the CAD drawing and make it easier for the designer to add and modify their design components. Clean-up or reduction of the CAD drawing's database file(s), and therefore the CAD drawing, occurs in the order of entity (a geometric object) exposure.

An entity could be a line, a circle, or any other graphic object with vector parameters, such as a line, start point (x,y,z), end point (x,y,z), etc., as well as a block or an X-Ref. A block is an internal database assembly of one or more objects, i.e., a line, arc, text, etc., to one entity, while an X-Ref is an external assembly of one or more data objects, i.e., blocks, blocks with graphic or non-graphic attributes, lines, arcs, text, etc., to one entity. Non-graphic entities can also contain other information, extensions, and application intrusion detection systems (AppIDS) that are not necessary to the subcontract designer. For example, a door (generally a block) might be attached to a graphic attribute, such as an arc representing the swing of the door, and non-graphic data, such as data defining the materials of the door, or its type or model. Hence, there is a hierarchy to exposing geometric objects in the database. For example, an X-Ref exposes blocks, and blocks expose attributes, lines, circles, arcs, etc., and attributes contain text.

In order to clean-up or reduce a CAD drawing without damaging the drawing, yet retain all of the information that will be of importance to the subcontract designer, it is first necessary to resolve (expand or expose) entities in the appropriate hierarchy, before any entities are removed or deleted. X-Ref's are resolved to become blocks (by expanding the X-Ref's to expose their sub-entities), followed by blocks (internal references that may also contain nested blocks and attributes, which may contain nested blocks and attributes, etc.). Blocks with attributes are resolved last. Some attributes contain text that may be useful to the user, while other text is not. For example, a block that represents a line may also contain attributes that identify the properties of a beam. When this block is expanded, pertinent data regarding the size of the beam might be exposed, as well as text that is only pertinent to the beam manufacturer, and can therefore be removed. As each hierarchical layer of entities is resolved, or once all of the X-Ref's, blocks and blocks with attributes have been resolved, the process of retaining, removing or altering all of the specific entities can be initiated.

FIG. 1 is a screen shot representing a main dialog box 10, which provides a simple interface for performing the main tasks of the invention. As illustrated in FIG. 1, a number of selectable buttons are illustrated for accessing or performing various functions. For example, the Q-Save and Save As buttons allow a user to do a quick save of the open drawing, or to save that drawing under a different name/location, respectively. In some cases, the buttons have a number written to either their left or right side. When that number is "0" the button is inactive and the text written on the button is only lightly visible. When the number is greater than "0" the button is active and the text written on the button is darkened. Irrespective of whether a button illustrated in FIG. 1 or any of the drawings is active or inactive, the present description will treat the button as active and discuss the functions and attributes associated with the buttons in detail.

Clean-up tasks are performed starting with the wizard function, illustrated in the upper one-third of FIG. 1, and then by selecting the tasks represented by the buttons listed below the wizard function. These buttons are laid out in the process that the user should use them to resolve all entities in the drawings. For example, X-Ref's must be resolved first, so the top button in the left column of buttons in FIG. 1 is the X-Ref's button 12. An X-Ref is an external reference file that is only referenced by a current drawing. An X-Ref is similar to a block, but is not accessible (editable) to the user of the current drawing until it is inserted into the current drawing (whereupon it becomes a block).

Once the X-Ref's are converted to blocks, the blocks can then be expanded (exploded). The user would continue in this fashion, moving from button to button to the bottom of the left column. Once all of the tasks represented by the buttons in the left column had been completed, the user would move to the top of the right column and proceed downward. The "Help," "Purge" (occasionally needed to remove an item from the database that has already been removed from a drawing, such as an empty layer, unused block, or other unused items) and "Exit" options buttons at the bottom of FIG. 1 can be performed at any time. The Exit function exits the current utility or function and returns the user to the main system.

As noted above, since X-Ref's are not usually manageable by the current drawing (the drawing being resolved), at least in AutoCAD, the X-Ref's must first be inserted into the drawing in order for the objects in the X-Ref's to become manageable (i.e., gripped and/or edited) within the parent drawing, which is accomplished through the X-Ref utility of the present invention. The X-Ref utility either inserts the X-Ref as a block into the current drawing or deletes the X-Ref. The present invention converts X-Ref's to blocks, where possible, because it can manage blocks easier than X-Ref's. When an X-Ref is converted to a block, the elements or objects of the X-Ref belong to the block, which belongs to the current drawing, and can be manipulated within the current drawing.

As illustrated in FIG. 1, there is one (1) X-Ref's in the drawing, as reflected by the "1" next to the X-Ref's utility button 12. This one X-Ref's must be resolved and reduced to zero (0) X-Ref's before the user can continue the cleaning/reduction process. When the X-Ref's utility button 12 has been selected, the X-Ref's are gathered and sorted as to their hierarchy and availability. Some X-Ref's may not be available, i.e., because they are missing or detached from some reason, even though a reference to the X-Ref's exists in the drawing and may result in a larger number of X-Ref's being reported in FIG. 1. If an X-Ref is not available, it must still be fixed in the X-Ref utility, as further described below in order to reduce the X-Ref's listed in FIG. 1 to zero.

Figure 2:
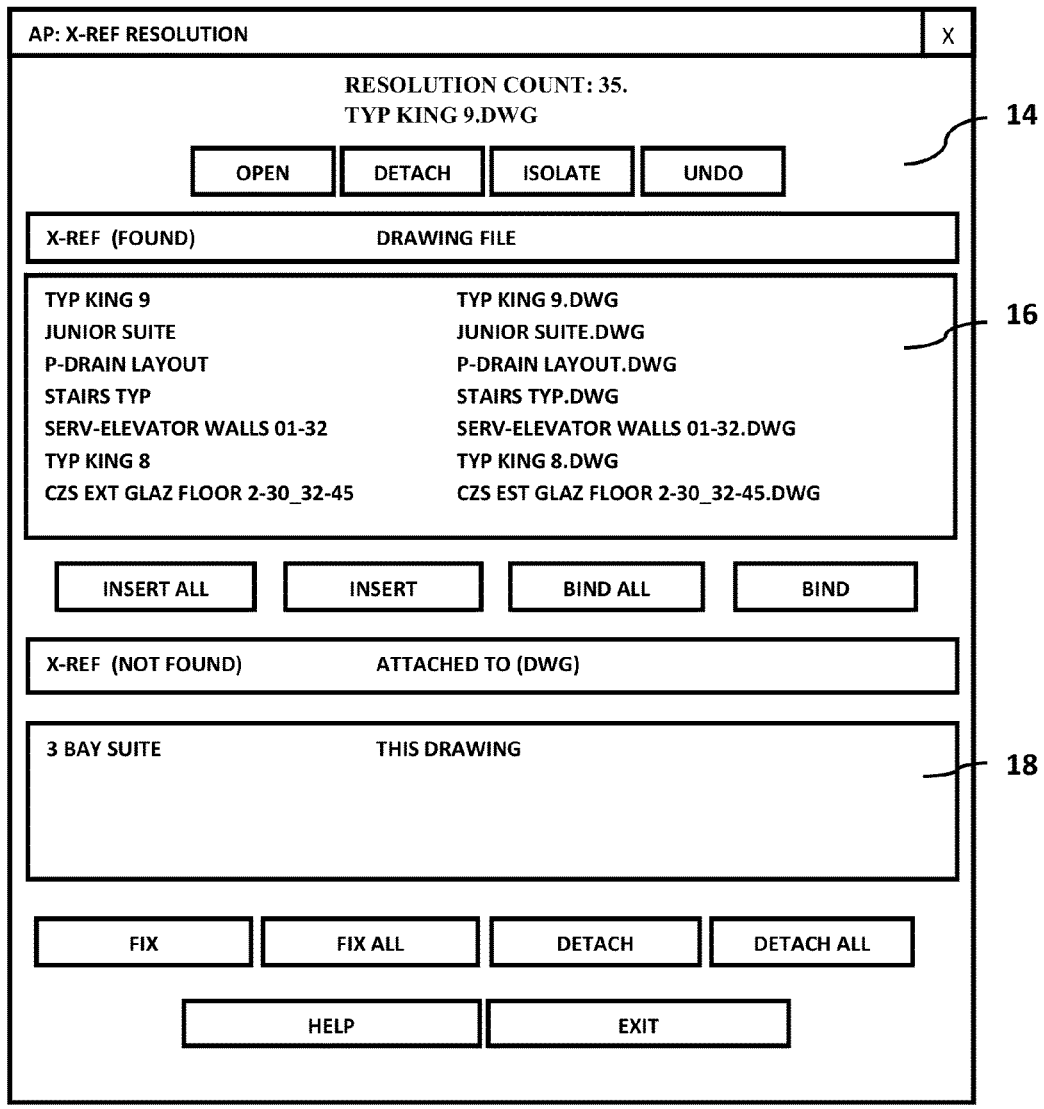
FIG. 2 is an illustration of an external reference resolution dialog box in accordance with the present invention.

FIG. 2 is a screen shot of the X-Ref resolution dialog box 14 of the X-Ref utility. Unlike FIG. 1, which only lists a single X-Ref, FIG. 2 lists numerous X-Ref's so all of the features of the X-Ref utility can be discussed herein. Each of the X-Ref's attached to the current drawing that exist in the specified search path (i.e., can be found), are listed in the top pane 16. The X-Ref's listed in the top pane 16 includes stand-alone X-Ref's and nested X-Ref's (X-Ref's with other X-Ref's attached), but the top pane 16 does not draw any distinction between stand-alone X-Ref's and nested X-Ref's because both can be found and the characteristics of the X-Ref's can be determined.

The bottom pane 18 lists X-Ref's that are attached to the current drawing, but either cannot be found in the specified search path (a file name and location is provided, but that file cannot be located at that location) or does not exist. If the X-Ref is a stand-alone X-Ref, then the bottom pane 18 indicates that it is attached to "This Drawing." If the X-Ref is nested, then the bottom pane 18 provides the search path for that X-Ref. For example, the X-Ref named "TYP BR1" indicates that the search path is "C:\Contracts\Fountainbleau\Cad 02-02-07\Tower\TYP . . . "

The first X-Ref's listed in the top pane 16 and bottom pane 18 are highlighted because they would be the first X-Ref's in either pane to be processed by default. The user could select other X-Ref's for processing instead by simply mouse clicking on a desired X-Ref. The buttons listed above and immediately below top pane 16 give the user various processing options for any X-Ref's in the top pane 16 and any X-Ref's in the bottom pane that include nested X-Ref's. The "Open" button will open the selected X-Ref in another editor. This enables the user to look at what is in the file, to detach X-Ref's that are attached to the selected X-Ref, to delete the file, etc. The "Detach" button allows the user to remove the selected X-Ref from the current drawing. The "Isolate" button allows the user to turn off all of the layers associated with all other X-ref's in the current drawing, except those layers associated with the selected X-Ref. This allows the user to view the elements (objects) associated with only the selected X-Ref. The "Undo" button undoes an action that changes the database of the current drawing and is only effective at undoing Detach, Insert, Insert All, Bind and Bind All commands. The "Undo" button further serves to erase the memory of the wizard function (to be described in detail below), which is recording each and every step taken by the user for future use.

The "Insert" button inserts the selected X-Ref into the drawing, thus changing the X-Ref (which cannot be managed) into a block (which can be managed). The "Insert All" button does the same thing, but for all of the X-Ref's, not just the selected one. The "Bind" button is used to bind a selected X-Ref into the drawing, thereby changing the X-Ref into a block. "Bind All" would do the same thing as the Bind function, but for all X-Ref's. Although the Insert and Bind functions sound identical, there is a difference in the way an X-Ref is handled from one function to the other. When an X-Ref is inserted, any blocks or layers in the drawing that are in the X-Ref are appended to the table for the corresponding block that is created. When binding an X-Ref, the table objects (layers, blocks, etc.) that are found in the X-Ref are preceded with a field name of the X-Ref. For example, if there was a layer named "WALLS" in an X-Ref named "XYZ" and the Bind function was used, the layer would be named "XYZ$0$WALLS." If the Insert function was used, the layer's name would remain "WALLS."

The buttons immediately under the bottom pane 18 are used to address unfound X-Ref's. The "Fix" button removes all references that do not exist from the selected X-Ref, relative to the current drawing, but does not remove the X-Ref itself. "Fix All" does the same thing for all missing X-ref's. The Fix and Fix All buttons do not insert the missing X-Ref's into the drawing and do not repair the missing X-Ref's. Rather, they attempt to re-attach the X-Ref in some manner so it can then be detached from the current drawing. The "Detach" button removes the selected missing X-Ref completely from the current drawing, and "Detach All" does the same thing for all missing X-Ref's. All four command functions can be quickly used to resolve all missing X-Ref's to zero.

Figure 3:
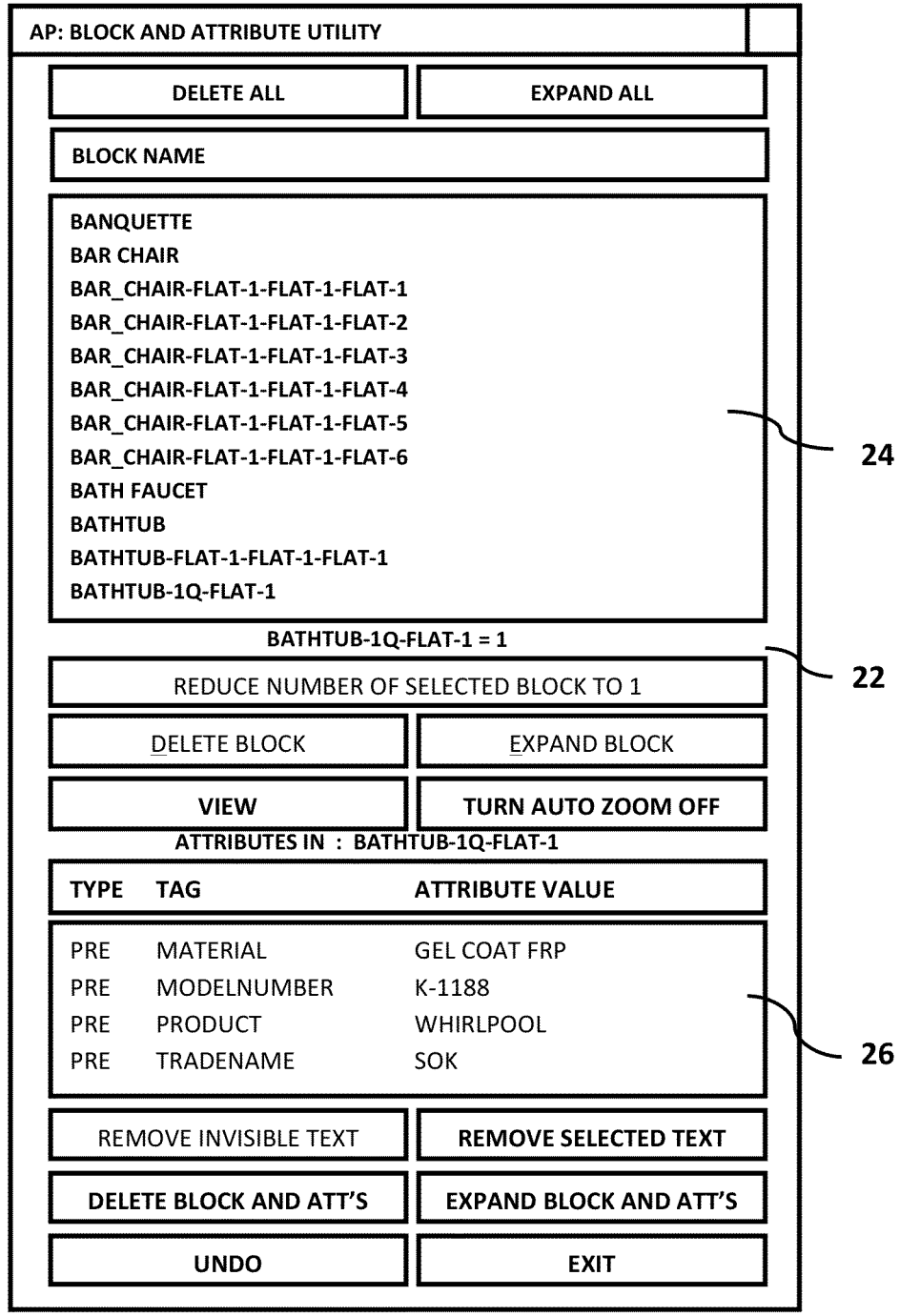
FIG. 3 is an illustration of a block and attribute utility in accordance with the present invention.

Once all of the X-Ref's have been resolved, the user would proceed to resolving the blocks by selecting the "Blocks" button 20 in FIG. 1. When the Block button 20 is selected, the program gathers and sorts the blocks based on their hierarchy and availability, including all of the blocks in the parent drawing and nested in other blocks. Once the blocks have been gathered, they are sorted alphabetically and listed in dialog box 22 of the Block and Attribute Utility illustrated in FIG. 3. Block Name pane 24 displays the blocks in the current drawing, with nested blocks proceeded by ">>" immediately following the parent block (none of these nested blocks are shown in FIG. 3). It is not unusual for as many as eight to ten nested blocks to be listed under a parent block. In the present embodiment of the invention, all blocks are intelligently handled to insure that all of the elements related to a block are placed on the element layer of that block and not the parent block layer or layer -0- when the blocks are expanded (exploded).

The Attributes pane 26 lists the attributes associated with a selected block in the block pane 24. Attributes are usually a cluster of fields associated with a block or part of a block. An attribute that contains one field of displayable information typically has three subfields: a Tag; a Prompt; and, a Value. The Tag is the name of the field. The Prompt is the text displayed at the AutoCAD command line, which directs or prompts the AutoCAD user to specify information pertaining to the block. The Attribute Value provides additional detail for a Tag. When the "Explode" command within AutoCAD is utilized on a block, the AutoCAD program does not usually place all of the elements in that block on the proper layer. As a result, attributes associated with that block can be lost. Likewise, using the AutoCAD "Explode" command on an attribute would typically leave the user with only the name of the field in the attribute. For example, an attribute with a Tag of "ROOMNO" would become exactly "ROOMNO," and any other information, such as a Value, in the subfields would be lost. Thus, if a block named "ROOMID" was inserted throughout the drawing with Tag information of "ROOMNO" and Values of "RM#2111" and "RM#2112," the Values would be lost and simply become "ROOMNO".

The buttons listed above the Block Name pane 24 pertain to the blocks in the Block Name pane 24. Since any action taken on a block can affect the attributes of that block, if a block selected in the Block Name pane 24 has attributes, the "Delete All" and "Expand All" buttons are disabled, which forces the user to process the attributes in the Attributes pane 26 and make proper decisions about the available information associated with the attributes. Once the attributes are processed, the block buttons are re-enabled.

To expand a block means to explode that block within the current drawing, i.e., reveal all of its constituent parts within the drawing. It is necessary to expand a block in order to get a better understanding of what is included in that block (in case it is to be kept or deleted, or further dealt with, in the case of a nested block) and to make use of all of the information that was included in the block in the drawing if it is kept.

The middle grouping of buttons, between the Block Name pane 24 and the Attributes pane 26, only apply to the blocks listed in the Block Name pane 24. The "Reduce Number of Blocks to 1" button deletes all of the selected blocks except for one of the selected blocks, and only if the blocks selected have multiple insertions with all of the same parameters. This function is useful when a number of blocks share identical information and exploding all of those blocks would result in the duplication of that identical information within the current drawing by the number of blocks (each identical object stacked on top of each other identical object). This way, one block is kept with the necessary information, and the rest are deleted.

The "Delete Block" button deletes the selected block. If the selected block has attributes, the Delete Block button is disabled until the attributes are processed. The "Expand Block" button expands or explodes the selected block. If the selected block has attributes, the Expand Block button is disabled until the attributes are processed. The "View" button presently writes the block to a phantom name in storage and then opens the block in a new editor so the user can view the content of the block before expanding or deleting the block. In a preferred embodiment, a preview function would accomplish the same result. When viewing a block, the system is set by default to automatically zoom to the location of the block within the drawing, versus requiring the user to manually search for and locate the block. The "Turn AutoZoom On/Off" button allows the user to toggle the auto zoom feature on or off before using the view function.

The buttons under the Attributes pane 26 only apply to the attributes. If a block in the Block Name pane 24 is highlighted and that block contains attributes, those attributes will be listed in Attributes pane 26. For example, the block "Bathtub-1q-flat-1" selected in the Block Name pane 24 contains a number of attributes that are listed in the Attributes pane 26. These attributes contain information about the material used to make the bathtub, its model number, the manufacture of the bathtub and its trade name. The attributes also include a Type indicator, such as whether the attribute text is preset (PRE), needs to be verified (VER), is a constant (CON) or is invisible (INV).

The "Remove Invisible Text" button deletes all attributes with any invisible type of text. Invisible text is text that is only displayed under certain conditions, but is otherwise displayed as empty boxes or rectangles. It can be very time consuming to isolate and delete invisible text using a CAD drawing program. The present invention enables invisible text to be easily deleted, which may be desirable when the user knows that the invisible text will not be needed for their purposes. As certain other aspects of the present invention utilize invisible text when automating the conversion of two-dimensional beams and columns into three-dimensional beams and columns, great care should be exercised when using the remove invisible text function.

The "Remove Selected Text" button removes the value of text from the selected attribute. When a block corresponding to the selected attribute is expanded, the text contained in the removed value will be blank. For example, the plumbing contractor may not need to keep information about the material used to make the tub and its product and trade name—the model number might be sufficient. In such a case, the user would want to remove all of the text except for the model number, so the unwanted text would be selected, and Remove Selected Text button would be selected. Since different block/attribute information is important to different users, the "Delete Block and Att's" button enables the entire block and corresponding attributes (and any information they may contain) to be deleted, while the "Expand Block and Att's" button allows the block and all information in the corresponding attributes to be expanded into the current drawing.

Referring back to FIG. 1, the "AEC" button 28 would be used next. The AEC button 28 is only active when the drawing being processed contains AEC objects. AEC objects are proxy objects created by other AutoDESK products, such as Architectural Destktop (ADT). Hence, AEC button 28 is reserved for AEC and other proxy objects generated by other AutoDESK products. In the drawing, these proxy objects are only displayed if the extension file (object enabler) for these objects is present (loaded). If the required extension file (generally an .arx or .dll file) is not loaded, then the basic elements (lines, circles, meshes, etc.) that make up the object are collected under their respective definition buttons (lines button 38, Arcs/Circles button 44, etc.) and processed accordingly. If object enablers are loaded, AEC button 28 will break any AEC objects present into blocks, thereby causing the user to return to the Blocks button 20 to further process those objects.

The "Custom" button 30 operates in a similar manner to the AEC button 28. Custom objects are objects defined by non-AutoCAD drawing systems, such as CAD-Duct, a 3D drafting software package by MAP Ltd. Custom objects are typically defined by an extension file such as .arx, .dll, .dbx, etc. These custom objects are complex objects generally made up of polygon meshes or 3D faces. For example, a ball can be represented by a polygon mesh by defining the fulcrum point of the sphere and a radius of the sphere. The smoothness of the ball would depend upon the resolution of the mesh. A mesh is like a window with four panes, whereas a 3D face is like a window with a single pane. The shape of any object can be defined by each connection point of each pane by giving each connection point x-, y- and z-coordinates. If custom objects, are present in the drawing, then Custom button 30 will break the custom objects into blocks for processing. If the object enabler for a custom object is not present, the basic elements forming that object are collected and processed accordingly.

Figure 4:
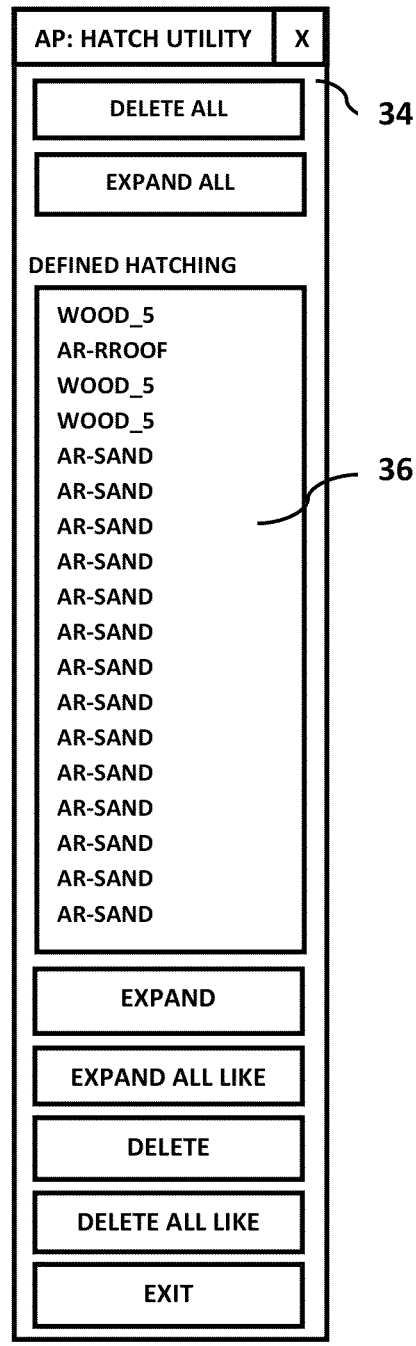
FIG. 4 is an illustration of a hatch utility in accordance with the present invention.

The "Hatching" button 32 of FIG. 1 causes all hatch patterns in the current drawing to be automatically gathered and the Hatch Utility dialog box 34 of FIG. 4 to be opened. A hatch is an object that applies patterns to user defined areas, usually defined by enclosed boundaries. As shown in FIG. 4, the user is presented with a list of all of the hatches used in the drawing in the Hatch pane 36. When a hatch pattern within the Hatch pane 36 is selected, such as "WOOD_5," the hatch utility automatically zooms to the selected hatch pattern with the current drawing and flashes the pattern (or highlights it in some other visible way) to enable the user to discern the hatch from other objects and make a decision about what to do with the hatch. This is an important function because hatches are sometimes used for physical objects (roofing tiles) versus designating the composition of material in an area (wood, gravel, sand, etc.). Where it may be desirable to delete a hatch related to the composition of materials, it may not be desirable to delete a hatch that defines a physical object.

If the user knows that none of the hatch patterns in the current drawing are needed, the user can select the "Delete All" button at the top of the Hatch pane 36. Selecting the "Expand All" button will cause all hatch patterns listed in Hatch pane 36 to be exploded into the objects the hatch patterns contain, such as lines, circles, arcs, etc. The buttons below the Hatch pane 36 give the user the ability to expand or delete selected hatch patterns, or to select a hatch pattern and then expand or delete any other hatch patterns that are the same as the selected hatch pattern. In the preferred embodiment of the invention, each hatch pattern and the coordinates for that pattern in the current drawing are saved for use by the wizard utility, to improve the clean-up accuracy of subsequently processed drawings. Also in the preferred embodiment, the user would be given an additional button from which to chose, a "Modify" button. This function would enable the user to change the hatch pattern of a selected hatch pattern to a different hatch pattern from a selected list of hatch patterns. Thus, rather than delete an odd hatch pattern that was used in the drawing, the user would have the option of modifying it.

Activation of the "Lines" button 38 of FIG. 1 causes the drawing to be searched for duplicate lines. Duplicate lines are lines that are visually positioned on top of other lines of exactly the same type. Duplicate lines are often created when other users have manipulated the drawing or copied or traced various areas of the drawing without cleaning up the extra lines they created after the fact. These lines increase the size of the drawing file and can cause problems when subsequent work is performed on the drawing.

Figure 5:
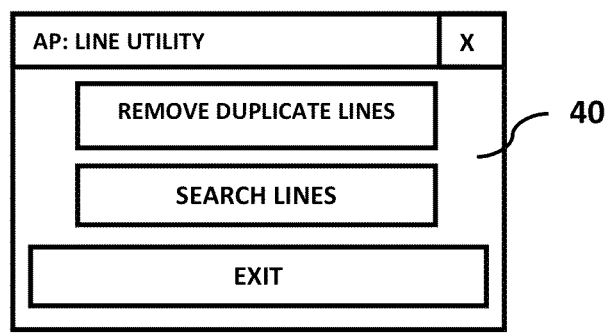
FIG. 5 is an illustration of a line utility in accordance with the present invention.

When the Lines button 38 is selected, a Line Utility dialog box 40 of FIG. 5 appears, presenting the user with two primary options; the "Remove Duplicate Lines" button or the "Search Lines" button. If the Remove Duplicate Lines button is selected, the drawing is searched for duplicate lines and any duplicate lines the system finds are deleted. To determine if a line is a duplicate, the system starts by gripping a line and scanning the drawing array for any vectors that are geometrically equal to the line gripped. If the gripped line is duplicated, it is deleted and the system moves on to the next line. The Search Lines button operates in a similar fashion, but allows the user to make a line-by-line determination, which can be helpful for finding lines that are not duplicate lines, but are buried behind other lines.

The Polylines button 42 of FIG. 1 works in the same fashion as the Lines button 38, in that it can be used to explode or separate polylines into separate segments, which can then either be left in the drawing or deleted. A polyline is a complex line that is formed of many segments and which may be left open or closed by connecting its end point to its starting point. As polylines are much less likely to be duplicated, and even when they are they take up much less space, so as an alternative embodiment it may not be necessary to even include a Polylines button in the preferred embodiment of the present invention.

The Arcs/Circles button 44 does not require any further user interaction. Rather, upon selection the drawing is searched for duplicate arcs and circles and the duplicates are removed. A duplicate arc or circle is defined as two arcs or two circles having the same properties and fulcrum point (x, y, z location).

Figure 6:
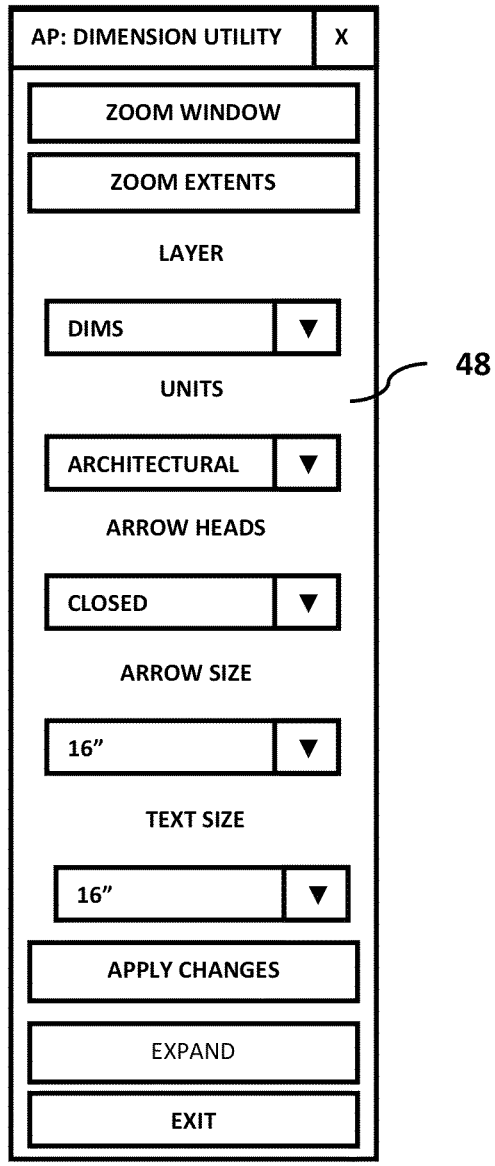
FIG. 6 is an illustration of a dimension utility in accordance with the present invention.

The Dims button 46 of FIG. 1 enables the user to set consistent formats for different dimensions throughout the drawing and prepares dimensions for import into other programs that may be used in conjunction with the present system. In FIG. 6, the Dimension Utility box 48 is shown with drop down menu selections for Layers, Units, Arrow Heads, Arrow Size and Text Size. The Layer menu contains a list of layers in the drawing, allowing the user to select the target layer for where dimensions should be placed. The Units menu contains a list of units of measurement for the properties of the dimension. The options are "Architectural," "Decimal," "Engineering," "Fractional" and "Scientific." For example, architectural units could all be set to use closed arrow heads, and arrows and text of a specific size. Other types of units could be given the same or different settings. The Zoom window button allows the user to momentarily exit the Dimensions Utility box 48 to maneuver to an area of the drawing. The Zoom Extents button zooms to the outer exterior of the drawing. Reconfiguring all of the units enables the user to focus on just particular units of interests and facilitates faster clean-up of the drawings.

The Mtext button 50 and Text button 52 of FIG. 1 effectively operate together. The Mtext button 50 enables the user to instantly convert any Mtext (multi-line text) to a standard text line. For example, a multi-line, Unicode-based text would be gripped and exploded, while maintaining all properties except the Unicode format by removing the Unicode and placing the text into a single line test, which is easier to process in the Text Utility dialog box 54 of FIG. 7. Converting multi-line text in this fashion has the added benefit of allowing the system of the present invention to be able to "read" the text so as to retrieve 3D element information for automated 2D to 3D conversion, as further described below.

Figure 7:
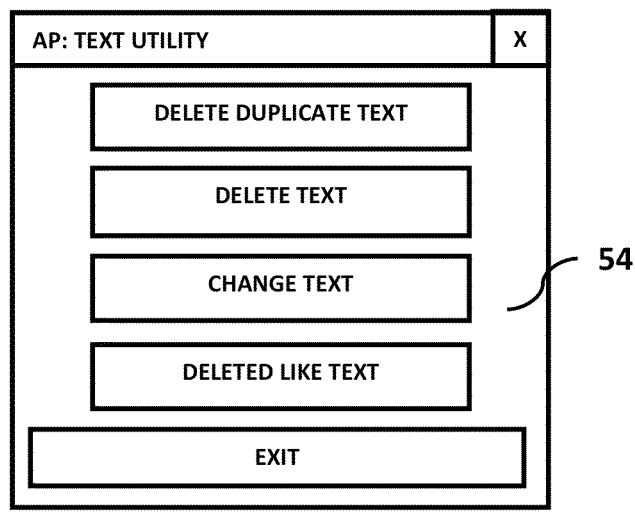
FIG. 7 is an illustration of a text utility in accordance with the present invention.

When the Text button 52 of FIG. 1 is selected, dialog box 54 of FIG. 7 is opened and the user is presented with a number of options. The Delete Duplicate Text button deletes text that has been written on top of the same text. It operates in the same manner as the Remove Duplicate Lines button previously discussed, i.e. it looks for text objects (versus lines) with the exact same properties, such as string, text style, and insertion point.

The Delete Text button provides a different option. When the Delete Text button is selected, another dialog box is opened that lists all of the unique text lines in the drawing. One or more of these text lines can then be selected to delete the selected items. This dialog box also includes an auto-zoom feature that allows the user to zoom to the point in the drawing where the text appears so the user can make an educated determination as to whether the selected text should be deleted or left alone. The Change Text button allows the user to alter a selected string of text and the Delete Like Text button prompts the user to select a single text object and have the drawing searched for any identical text. When identical text is found, the user is presented with a "Yes" and "No" dialog to determine if the identical text should be deleted or left alone.

The Text Styles button 56 of FIG. 1 displays all of the defined text styles that are used in the drawing, as well as one or more additional text styles that were not utilized in the drawing, and gives the user the option of selecting one of these text styles. When a text style is selected, the user is then given the option of converting some or all of the text styles in the drawing to the selected text style.

The four layers buttons, Lyrs On button 58, Lyrs Off button 60, Lyrs Froze button 62 and Lyrs Locked button 64, are primarily informational in terms of telling the user how many layers exist in a drawing and the state of each layer. Selecting the Lyrs Off button 60, the Lyrs Froze button 62 or the Lyrs Locked button 64 will cause the layers supervised by the selected button to reverse their state. For example, selecting the Lyrs Froze button 62 would cause any layer that is currently frozen to be unfrozen.

Figure 8:
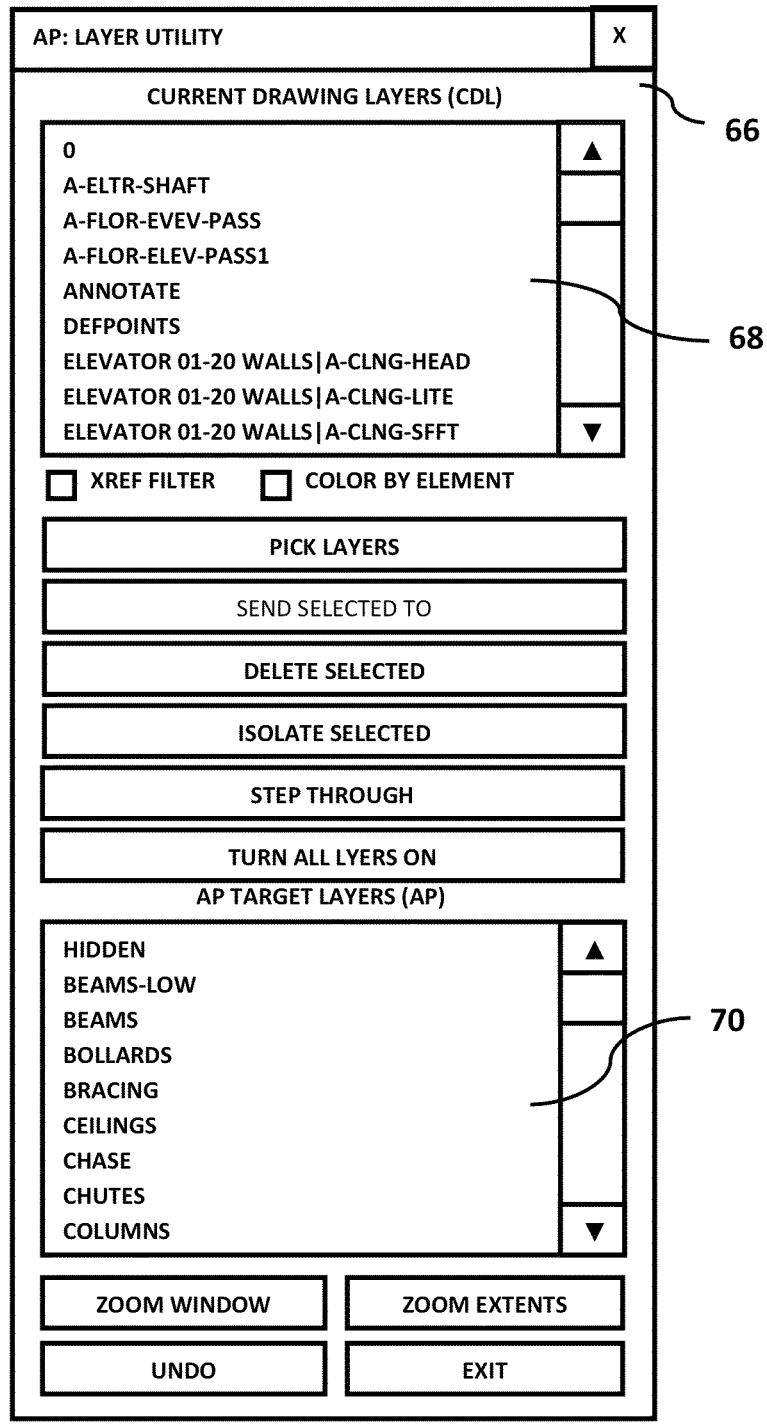
FIG. 8 is an illustration of a layer utility in accordance with the present invention.

Selection of the Lyrs On button 58 would open the Layer Utility dialog box 66 of FIG. 8, which displays all of the layers in the current drawing in the Current Drawing Layers (CDL) pane 68 and provides the user with a number of useful functions. The two selectable options under the CDL pane 68 are "X-ref Filter" and "Color By Element." The X-ref filter option causes any layers that are referenced by the prefix of an external reference to be masked. For example, the X-ref named "ELEVATOR 01-20 WALLS" would be masked, so that the layer entitled "ELEVATOR 01-20 WALLS I A-CLNG-HEAD" would simply be listed as "A-CLNG-HEAD." By masking the X-ref, it is possible to treat all of the layers with the same name, such as A-CLNG-HEAD, in the same manner. Thus, an operation performed on A-CLNG-HEAD would also be performed on any other layers of the same name, irrespective of their different X-ref's.

The Color By Element option maintains a color by the object flag of that object. When these objects are then imported into another program, such as AutoSPRINK, the default setting of that object will be Color By Element. The Pick Layers button returns the user to the drawing editor and prompts the user to select objects. As objects are selected, the objects are saved to a unique list. When the user returns to the Layer Utility 66, the layers that are in the list are highlighted and the user is given the option of using the remaining buttons of the utility to reach a desired result. The Send Selected To button is operative where there are multiple selections in the CDL pane 68 and only a single selection in the AP Target Layers (AP) pane 70. Selection of this button would send any selected layers in the CDL pane 68 to the targeted layer in the AP pane 70. Any remaining empty layers are then purged from the drawing and removed from the CDL pane 68.

The Delete Selected button deletes all objects in the layers selected within the CDL pane 68. The Isolate Selected button turns off all layers except for the selected layers in the CDL pane 68. The Step Through button starts at the first layer in the CDL pane 68 and turns off all layers except the selected layer. Subsequent selection of the Step Through button steps the user to the next layer in the CDL pane 68 and turns off all other layers, etc. The Turn All Lyrs On button turns on all of the layers remaining in the CDL pane 68.

Figure 9:
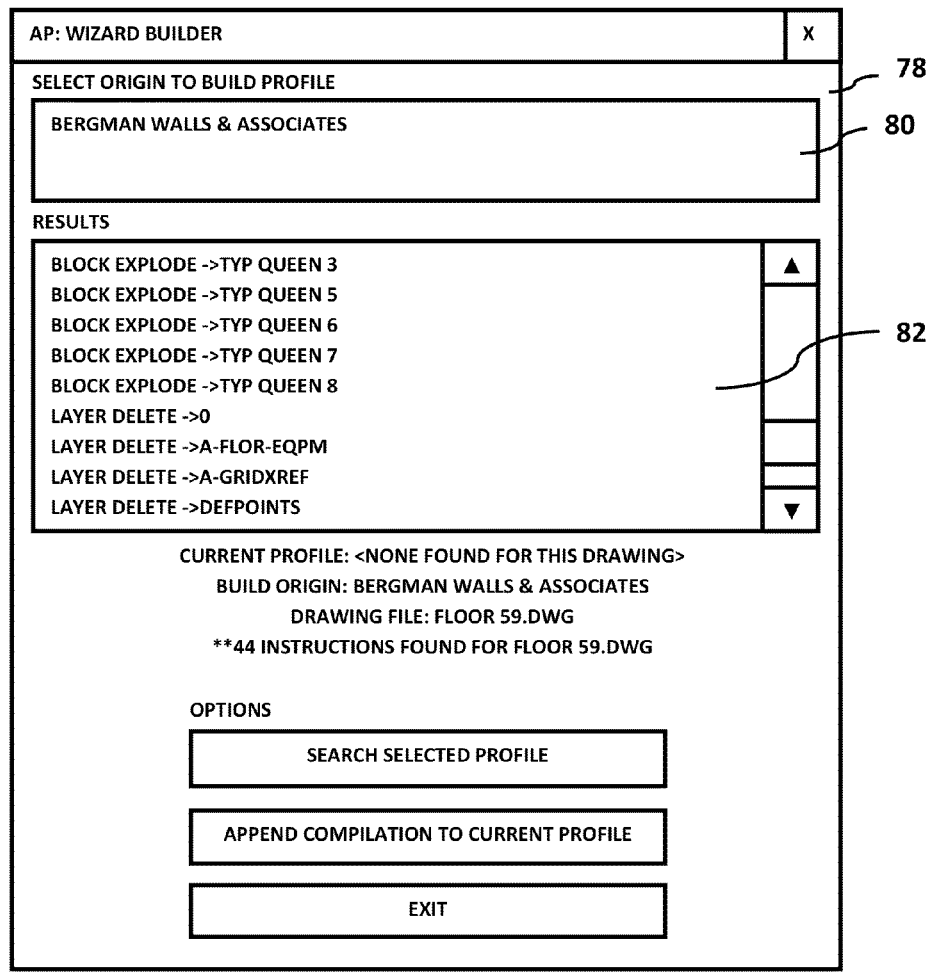
FIG. 9 is an illustration of a wizard profile builder utility in accordance with the present invention.

When work is completed with the four layers buttons, the clean-up process is completed. If a wizard was running during the clean-up process, many of the functions or steps taken by a user to modify the drawing will have been recorded for future reference or use in cleaning-up additional related drawings. To better understand the wizard function, reference is now made to FIGS. 1, 9 and 10. The Wizards module 70 of FIG. 1 is comprised of five components, the option list 72 and four function buttons. The option list 72 includes a listing of all of the wizards that are available for use with the current drawing. Once a wizard has been selected from the list 72, that wizard would then be displayed within the window of the list while the user is cleaning-up the current drawing.

To create a wizard from scratch for the current drawing, the user would select Create Wizard Profile button 74. When button 74 is selected, the user is directed to another dialog box prompting the user to enter a wizard name. The user could create any name, or use a name based on previously created wizards, a list of which is provided to the user in the dialog box. Once a name has been selected, the user is directed to another dialog box that prompts the user to select or enter the name of the source of the drawings. The source of the drawing would typically be an architectural or engineering firm, or an individual. This dialog box would also include a list of previous sources of drawings used for other clean-up processes, to make the task of selecting a source easier. Once the source of the current drawing has been established, the wizard would be saved and added to the option list 72.

Source information for drawings is important when using the Build Wizard Profile button 76, which gives the users the option of searching other wizards, based on their source, and importing instructions from other wizards into the wizard being built. For example, with reference to FIG. 9, when button 76 of FIG. 1 is selected, the user is directed to the Wizard Builder dialog 78, which prompts the user to select a drawing origin from a list of all available sources, based on previously created wizards, in Origin pane 80. When an origin is selected, the user would click the Search Selected Profile button to get a listing in the Results pane 82 of all of the available instructions previously created related to that source. The instructions are shown to enable the user to determine if the selected source includes the types of instructions they want to use to build a new wizard. If the selected source includes the desired instructions, clicking on the Append Compilation To Current Profile button would accept the instructions and append them to the wizard profile being created. This same process could be repeated with one or more other sources so that a number of different instructions could be appended to the wizard being built. Once the wizard was built and stored, it would be added to option list 72 of FIG. 1.

To run a wizard profile, the user would select the wizard from those listed in options list 72 and click on the Run Wizard Profile button 84. A wizard profile dialog box would then appear giving the user the choice of running all of the tasks listed in the main dialog box 10 of FIG. 1, or just select ones of those tasks. The process of running a wizard profile is further illustrated with respect to FIG. 10. When the WIZARD 86 is initiated, the DRAWING FILE 88 is accessed and opened, and as the user performs different function or steps to modify the drawing, the wizard records each of these steps. The manner in which the wizard records and prioritizes recorded functions aids in the subsequent thorough cleaning of revised or other drawings.

As the user is required to address X-ref's first, the wizard does likewise with X-REF 90. There are three options for the resolution of X-ref's: detach (delete), insert and bind. The logic assigned to these functions from a programming perspective (controlled by the AutoCAD variable "BIND-TYPE") is "−1" for detach 92, "0" for bind 94, and "1" for insert 96. Binding an X-Ref is separate from inserting. Binding an X-Ref creates the layer contained in the X-Ref with a prefix in the following format: XREFNAMEO$OLAYERNAME. Utilization of binding, however, can create hundreds of layers, which can have undesirable results when subsequently using the Layer utility, although use of the X-Ref filter option described above can help. The logic assignments and any layer names that are created would then be recorded to the wizard.

The BLOCK 98 includes similar options that are recorded with the block name and the action taken, such as delete or explode. AEC blocks would be treated the same as blocks, although their additional geometry would also be stored. Customer blocks would be treated the same as AEC blocks. The HATCH 100 stores the pattern and the points and whether the hatch was erased or saved. When future drawings are scanned by the wizard, the wizard will grip a hatch and search the profile for the exact same pattern and points. The hatch will then be resolved based on what happened in the first drawing clean-up and whether the hatch was erased or saved. Line, polyline, arc and circle functions are not recorded by the wizard. Rather, these functions are handled by the main dialog box 10 during the normal clean-up process.

Figure 10:
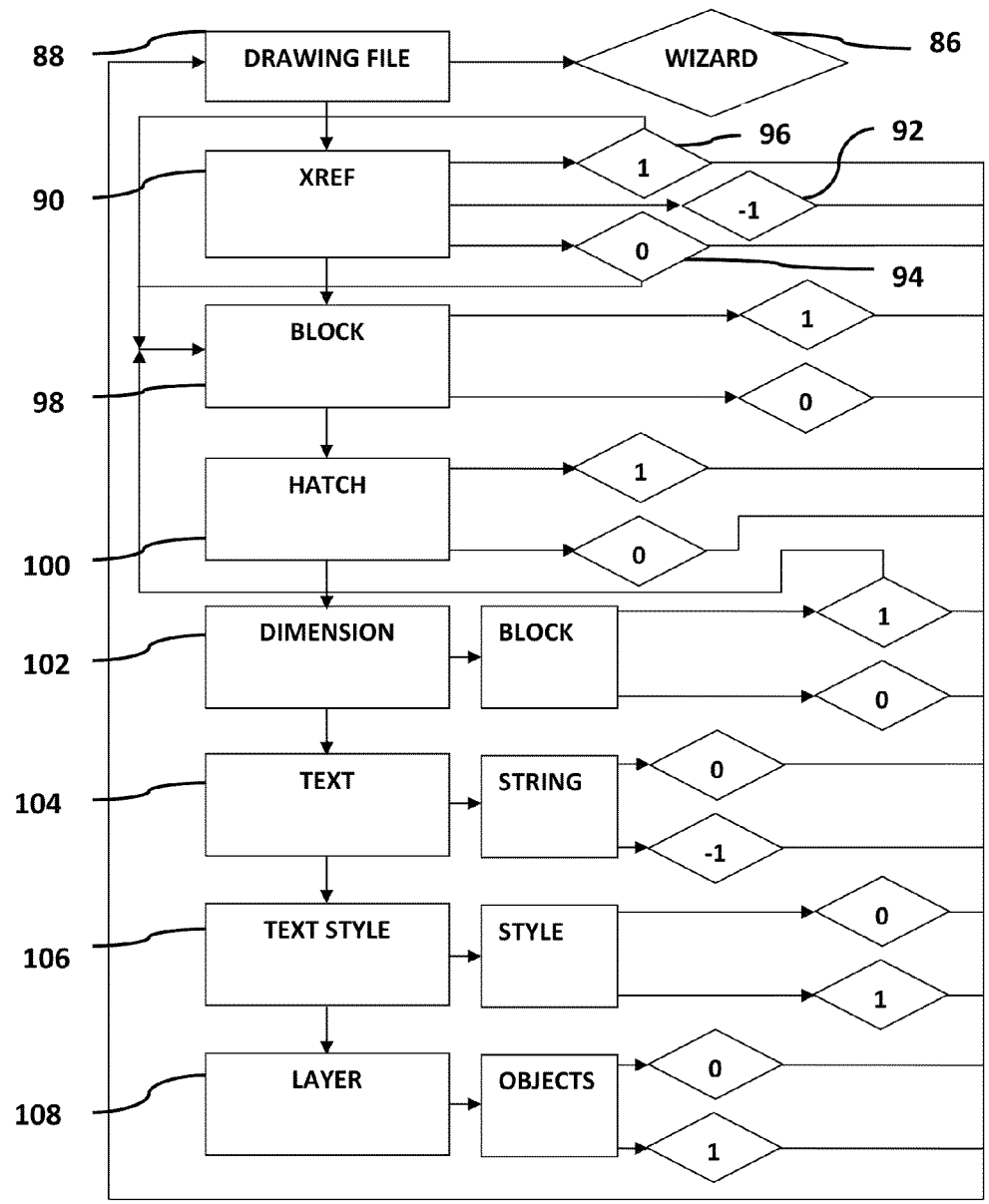
FIG. 10 is a flow chart illustrating a clean-up wizard process in accordance with the present invention.

A DIMENSION 102 is processed so as to disassemble it from the block within which it is contained. Any Unicode formatting is removed from the text and the line and arrows are divided into two entities. While dimensions are presently processed as a whole group, an alternative embodiment would be to enable the user to select and alter individual dimensions. Mtext functions are not recorded by the wizard and are handled in the same manner as in the main dialog box 10 of FIG. 1. In FIG. 10, TEXT 104 functions are recorded into the wizard, with string deletions or changes being recorded. TEXT STYLE 106 functions are recorded, as are LAYER 108 functions, i.e., merging a layer or deleting a layer. The wizard function substantially reduces the amount of effort and time required to clean-up drawings that are from the same source or that are similar to a previously cleaned-up drawing.

Once a drawing has been cleaned-up, it is desirable to compare that cleaned-up drawing to prior versions of the same drawing to get an understanding of what has been changed from one revision or delta to another. While drawings that have not been cleaned-up can also be compared to prior drawings, the unnecessary information cluttering an unclean drawing can make it difficult for a user to visually discern where changes have or have not been made. The system of the present invention provides a compare utility that greatly simplifies the process of understanding and working with revisions, identifying where changes have occurred, and highlighting those revisions by colorization in a highly efficient and user friendly manner.

Naturally, the compare feature of the present invention is also capable of comparing any two drawings, even where one is not a revision of the other. When the system detects that two drawings to be compared are not similar, it will warn the user and if the user accepts the warning, then the system will compare the dissimilar drawings. As noted below with respect to FIGS. 12a and 13, the Batch Load compare feature of the present invention can be useful when comparing a large number of both similar and dissimilar drawings. For example, when a user is attempting to determine the degree of commonality between the drawings of different floors of a multi-story building, the ability to batch compare a large number of drawings, including those which are dissimilar, can be very handy. In this manner, the one or two dissimilar floors out of 30 or 40 similar floors can be picked out very quickly.

The compare utility allows the user to view any changes that have or have not been made from one version of a CAD drawing to another. Any revisions that have or have not been made can be readily viewed to determine what the modifications are or are not and whether those modifications, or lack thereof, are relevant to the user's work on the current drawing. It also contains a preview feature that allows the user to view all changes to the drawing prior to accepting or importing the drawing into other CAD formats.

The compare utility also has the ability to zoom in on a filtered set of drawing elements/objects and to continue filtering down into the drawing until it researches the simplest drawing component of each individual component group or object. This allows the user to automatically zoom in and view a first selected group of components, and then zoom in and view a smaller section or components within that first selected group, and then zoom in again and view an even smaller set of components, etc. At any time during this process, the user can select components and capture information about those components to include those components and information in a bill of materials, scheduling program, etc. This feature is of particular importance in BIM (Building Information Management) projects.

Figure 11:
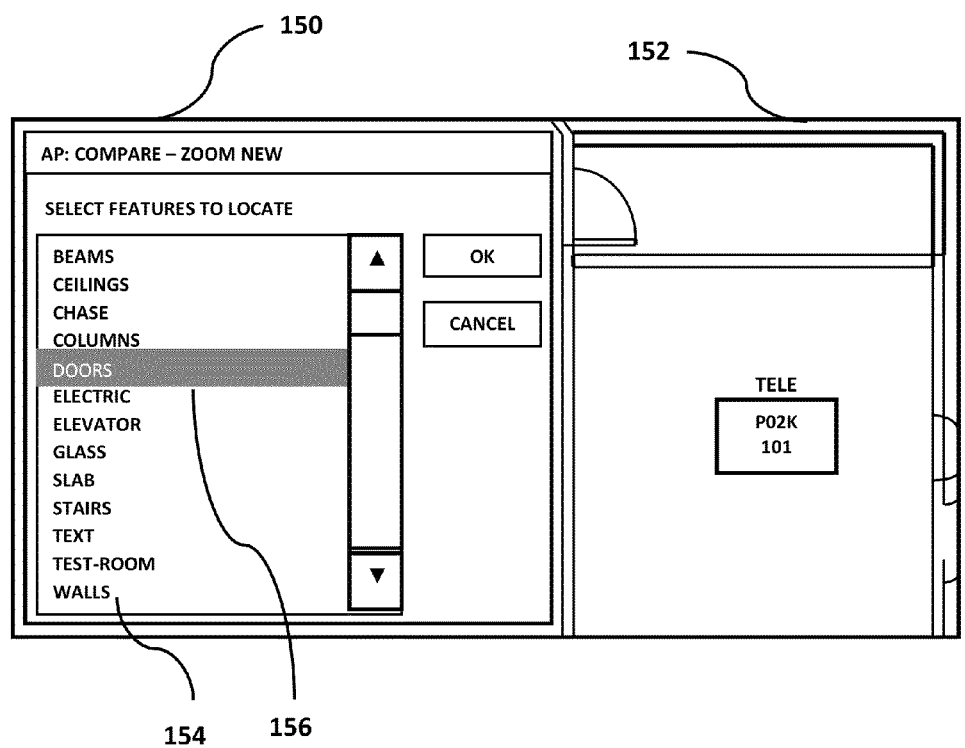
FIG. 11 is an illustration of a compare zoom feature in accordance with the present invention.

For example, as illustrated in FIG. 11, the compare zoom feature 150 may have first been used to zoom in on any new walls 152 that might have been added to a revised drawing. This would be done by selecting walls 154 from the list of selected features to locate and then hitting the OK button. The system would then zoom in on any new walls 152 that have been added, which are illustrated in a different color (or highlighted in some other way) than unchanged objects in the revised drawing. In order to prepare pricing information for the added walls, or to revise scheduling to accommodate the added walls, the system could then capture information related to all of the changes involved in adding the walls, including all parts that might have been included within the walls, such as the wood or metal studs and slats, the sheetrock, the attachment screws, the door frames, the doors and all door components, including hinges, door knobs, etc.

Once the information on the changes has been collected, a bill of materials can be automatically generated and sent to the appropriate program or system for processing the bill of materials. Likewise, if the user comparing the drawings happens to be the hardware manufacturer for the door systems, the user can continue to filter down with the zoom command to just capture the door hardware for all of the added doors in the revised drawing and nothing else.

An additional feature of the compare utility is its ability to determine and display changes in square footage based on changes between the old drawing and the new drawing. As with other features, changes in square footage can be determined on the macro-level (the entire building) or on any of a number of selected micro-levels. For example, if the user only wanted to determine the change in square footage on a level of a building, this could be determined by comparing that level of the building from the old drawing to that level of the building from the new drawing. Likewise, one room or set of rooms could be compared between the two drawings to determine square footage changes between the old and new drawings. Altered square footage could also include the amount of square footage in the drawing that includes revisions or changes and the total variance between the old and new drawings. Other variances are also reported, such as X-Ref's attached to the old versus new drawing, X-Ref's inserted into the old versus new drawings, the status of various layers at the time the comparisons were completed (i.e., whether all layers were included, whether frozen layers were included, whether locked layers were included, etc.). Obviously, many more variance features could be included as well.

To initiate the process, as illustrated in FIG. 12a, the Drawing Compare Utility dialog box 157 prompts the user to select the base drawing (such as the original drawing or a prior revision drawing) and the currently revised drawing, and then make some choices about options to be applied to the comparison. The options include:

(1) All Layers On, which results in all layers being turned on in each drawing (if unchecked, only layers that are turned on in each drawing would be compared, with turned off layers being ignored);

(2) Thaw Layers, which thaws any frozen layers so they can be included in the comparison (otherwise frozen layers are ignored); and (3) Un-Lock Layers, which un-locks any locked layers, which would otherwise be ignored.

Figure 13:
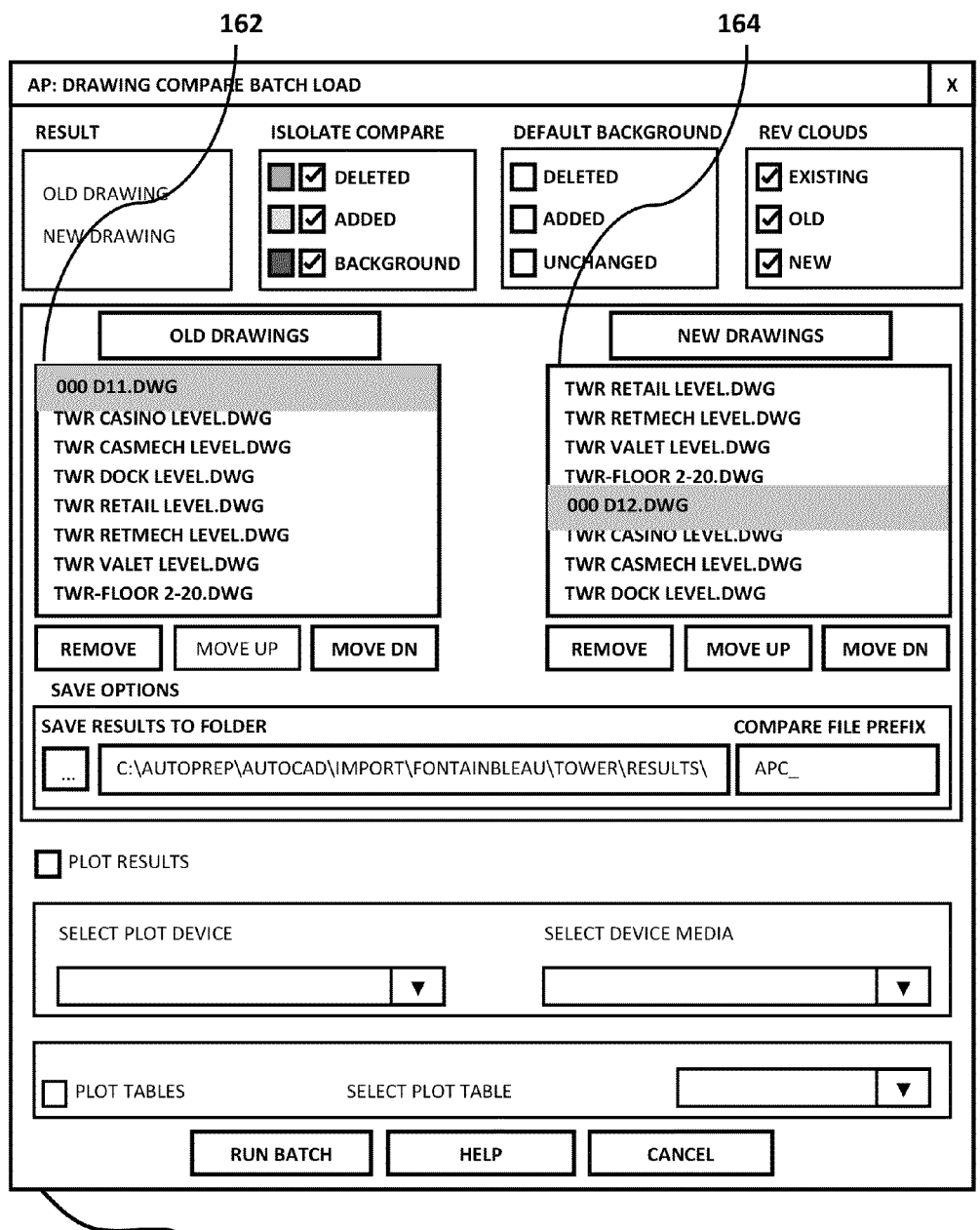
FIG. 13 is an illustration of a batch load compare feature in accordance with the present invention.

As previously noted, in addition to these drawing options, the dialog box 157 contains a program option to "batch load" up many drawings (similar and dissimilar) or a complete set of both base and revision drawings to allow the user to simply toggle through numerous drawings or an entire set of revised drawings—one at a time. The ability to batch compare several drawings and have the system automatically perform the operation without further user input is a very useful feature. Even more so because as illustrated in FIG. 13, the Batch Load function 160 allows the user to place hundreds of drawings (up to 1024) in the old drawing file list 162 and hundreds more (again up to 1024) in the revised drawing list 164, in any order, and the system will automatically find all of the similar drawings to compare to one another and perform the comparison functions automatically. If any drawing in the new drawing list is missing a corresponding revised drawing, or for any reason a drawing could not be compared, the system will provide an error message list.

A number of conversion options can also be selected by the user as shown in FIG. 12b. The comparison options 158 can also be used for assisting in the conversion of objects from any type of CAD or other drawing program, such as AutoCAD, into any type of third party program, such as AutoSPRINK. The X-Ref's option gives the user the ability to insert X-Ref's that are attached to the drawings to be compared (which is the default setting), or to ignore X-Ref's in the drawings to be compared. The blocks option gives the user the ability to retain blocks as blocks, or to cause the blocks to be expanded (exploded) into the drawings as their individual elements. Since proxy objects may be useful to some users when comparing results, the Acad proxy option either compares AutoCAD proxy objects (when checked) or ignores them, while the custom proxy option gives users the same option for non-AutoCAD proxy objects.

The 3D solids and 2D solids options give the user the ability to compare such objects (when checked) or to ignore them. Likewise, checking the remaining boxes either cause the specified objects i.e., dimensions, meshes (including polygons and polyface meshes), regions and hatches, to be compared or ignored.

Once all of the options have been selected, the process begins by placing the base drawing file into an editor that one-by-one reads all of the objects or entities (such as lines, mlines, 3D solids, hatches, etc.) and their properties, converts all of the graphical objects to text, and places the text in an array. The text and properties are then written out to storage through a compressor that truncates the properties as much as possible without losing data. When all of the different types of objects have been processed, the editor is purged and the revised drawing is inserted for processing in the same manner.

Figure 14:
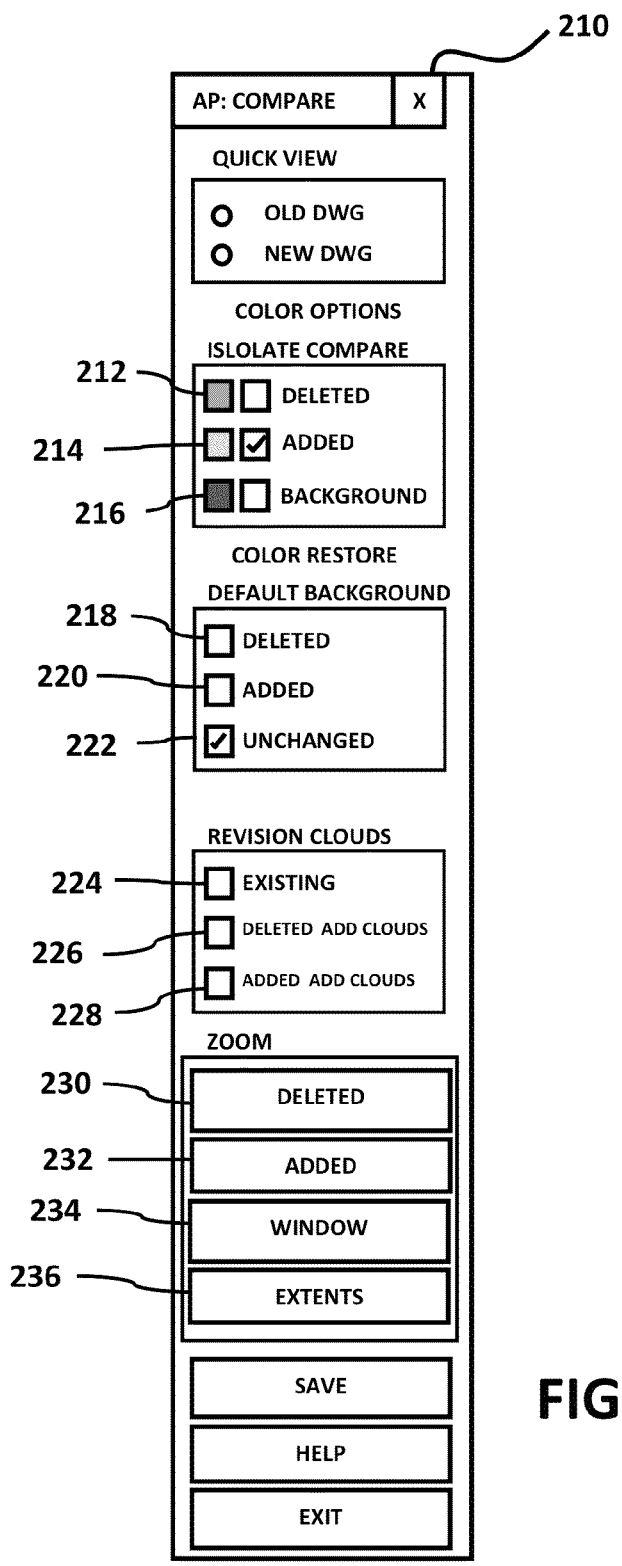
FIG. 14 is an illustration of the compare utility of FIGS. 12a and 12b further illustrating conversion options in accordance with the present invention.

The text files generated from the compressor are then opened by object type, i.e., line, circle, etc. Lines from the base drawing file are read and placed in an array, while lines from the revised drawing file are read and placed in a separate array. The two arrays are then compared and the results are drawn from the editor. This process is repeated for all entities or objects in the drawing files. Once all of the entities or objects have been compared and drawn from the editor, the compare drawing is saved according to the user defined settings and options of FIGS. 12a and 12b. The original makeup (layer structure) of the old and new drawings is stored to the compare drawing. This allows the compare drawing to maintain the original (old) and modified (new) settings, which can be visually and digitally discerned through the various options of the Compare Manager, set forth in FIG. 14.

In addition to storing the layer structure, several types of non-object data are also stored, such as the status of X-Ref's, blocks and other settings. As previously noted, this enables variance square foot measurements to be calculated, but also allows information to be stored about the user, the work station they were using, the date, time and other settings. The user also has the option to sending the compare drawing (as a digital plot, bitmap, JPEG or other file) to other parties along with notes and other details that will enable the receiving party to perform a task based on the information they were sent, which is useful in the BIM context. Compare files can also be assigned to specific directories and those directories can then be assigned or shared with interested parties.

The dialog box for the Compare Manager 210 is generated once the compare drawing is complete and gives the user several options for viewing changes in the compared drawing. Dialog box 210 contains a Quick View option that enables the user to display either the base (old) drawing or the revised (new) drawing before doing the comparison. The next section of dialog box 210 lists three sets of Color Options check boxes, each set positioned next to a colored box. The top Check box 212 corresponds to deleted/removed objects, the middle Check box 214 corresponds to added/revised objects, and the bottom Check box 216 corresponds to unchanged objects or the background. The color of the colored boxes that correspond to Check boxes 212, 214 and 216 can be changed by the user to any color desired, although users would generally want to use three different colors.

The Check box 212 gives the user the option to show objects that may show as having been deleted in the revised drawing, objects that have been deleted in the revised drawing, or only the layers that contain objects that do not appear in the revised drawing. To hide objects that may show as having been deleted or that do not appear in the revised drawing, the user would simply uncheck the Deleted Check box 212. If the objects are to be shown, the objects will be displayed using the selected color. Alternatively, the system could be set up to isolate and display the deleted objects or include the deleted objects in background, using the selected color versus hiding them.

Check box 214 gives the user the option to isolate and display only objects that do not appear in the base drawing (i.e., have been added to the revised drawing) or the layers that contain objects that do not appear in the base drawing. If the objects are to be shown, the objects will be displayed using the selected color. Alternatively, the system could be set up to display the objects using the selected color or to just include them in background (basically as unchanged), versus hiding them, i.e., unchecking the Check box 214 (for Added) will hide objects that do not appear in the base drawing. Likewise, Check box 216 gives the user the option to display only the objects or layers with objects that were not revised (i.e., common to both drawings), or to hide objects that were not revised (i.e., hide background). If the objects are to be shown, the objects will be displayed using the selected color. Alternatively, the system could be set up to display the objects using the selected color or to just include those objects in background, versus hiding them to isolate deleted or added items as explained above. The user is also given the option of selecting any color from a wide variety of colors.

By showing only the objects that concern the user, such as objects that were added, or objects that were removed, or even the objects that were unchanged, and by showing them in a selected color, it is possible for the user to visually focus on the different aspects of the compared drawings that interests them the most. Likewise, being able to hide selected new, removed or common elements can speed the review process as well. Hence, in a complex drawing with thousands of objects, but only a few changes, the user could remove all of the unchanged (background) objects from view and just focus on the changes. Or, if many things were changed, the user could just focus on what was not changed. Obviously, the manner in which the compare utility can be used to help a user focus on just the items of interest is unlimited and could be structured differently from that described above.

Once the review process has been completed, the user can return the entire drawing to its original default colors for all objects using the Color Restore section of dialog box 210. Check box 218 would be selected to return deleted objects to their original colors, Check box 220 would be selected to return added objects to their original colors, and Check box 222 would be selected to return unchanged objects to their original colors. Different selected combinations of check boxes, between Check boxes 212, 214 and 216 and 218, 220 and 222, can be used to create all types of different effects. For example, the user can choose the original Default Background or Unchanged Items color by checking box 222, while showing the Deleted and/or Added items in a user specified color by checking boxes 212 and 214, or any combination thereof. Check box 224 can be used to display any Revision Clouds that may be in the drawing, or conversely to hide them by not checking the box. If no revision clouds exist in the drawing, the user has the option of adding them by selecting check boxes 226 or 228. Check box 226 is used to add revisions clouds for deleted objects and check box 228 is used to add revisions closure for added objects. Unchecking the check boxes 226 and/or 228 will remove the revision clouds from the drawing.

As previously discussed, the Zoom section of dialog box 210 includes a number of zoom-related features. Deleted button 230 and Added button 232 enable the system to automatically zoom to any added or deleted objects in the drawing. Selection of either button 230 or 232 opens a pop-up box that includes either all of the deleted or added objects, respectively. Selection of any item within this pop-up box would cause the system to automatically zoom to that revised item. To manually zoom to an area in the drawing, the user would select the Window button 234. Pressing this button will produce a user definable window that can be placed anywhere in the drawing, and once placed, the system will zoom to the window boundary. Conversely, by pressing the Extents button 236, the system will zoom-out to the full extents of the drawing.

In addition to focusing on deletions, additions and background objects, with so many different designers working on a common set of drawings, it is to be expected that conflicts will occur between the objects added, changed or left unchanged by the different designers. Conflicts (also called "alerts") include pipes running through beams, columns and HVAC ducts, conduits or cable trays running through pipes and ducts, etc. Although it has been known in the art to identify a conflict or alert, to provide information about where a conflict occurs, and to provide the conflict direction (a measurement of the amount of conflict between two objects), the present invention takes the conflict recognition and resolution process to an entirely new level.

Although the present invention was developed for use in the context of fire sprinkler design, it has applicability to any trade involved in the CAD building design process, or with respect to any type of CAD drawing system, whether the system is being used to design roads, bridges, buildings, automobiles, aircraft, etc. By selecting an appropriate command, the system will perform a check of all of the objects within a drawing to determine if any conflicts exist between any objects. In the context of a building design, each conflict would be detected and can then be designated by trade. For example, the steel trade (the columns and beams) would be designated separately from HVAC, plumbing, electrical, fire sprinkler, or any other trade. To visually highlight each conflict, an area surrounding the conflict would be surrounded by a three-dimensional translucent alert bubble element that would permit a clear view of the obstructed situation, while drawing attention to the conflict.

A clipping plane is similar in some respects to a modeless drawing window in that it allows a user to isolate a certain portion of a drawing to a visibly limited area and allows the user to test out or make changes to objects within this visibly limited area. Generally, changes made within a modeless drawing window have no effect on the underlying drawing from which the modeless drawing window was created. Rather, the modeless drawing window allows the user to test out changes, such as moving different graphic objects and rearranging graphic objects to see how those changes would work out if implemented in the underlying drawing. In contrast, a clipping plane is a bounded area that is created within the drawing itself that allows the user to make changes to the drawing directly when those changes are made within the bounded area. However, the clipping plane also allows the user to visually isolate graphic objects within the bounded area such that only objects that are visible within the bounded area can be changed within the drawing. The operation of clipping planes is further explained below.

Within a large, complex drawing, there will be many visible and hidden graphic objects within any view of the drawing. For example, in a drawing displaying a fire sprinkler drop close to an HVAC duct, an electrical wiring tray, plumbing pipes and building structural members, it might be difficult to attempt to work on changes to the fire sprinkler drop without also changing other graphic objects that were visible around the fire sprinkler drop, or that were hidden and around the fire sprinkler drop. To create a clipping plane and isolate certain graphic objects, such as the fire sprinkler drop, the user would pick a point of interest within the drawing, such as a single point on or near the fire sprinkler drop, and lock that point so it remains stable (locking a point is optional). The user could then center the drawing around that point of interest, although centering on the point of interest is also optional.

Once the point of interest had been selected, the user could then click on and drag a slider of a slider bar (not shown) to contract or expand the size of the bounded/bounding box centered on the point of interest. The bounding box need not have visible lines defining the box. The user could contract the size of the bounding box to just the point of interest, or expand it from the point of interest to include those few graphic objects around the point of interest or a much larger number of graphic objects. Once size of the clipping plane had been selected, the user could make changes within the clipping plane, with those changes only affecting graphic objects in the drawing that were visible within the bounding box. Hidden objects, objects outside of the bounding box, or objects note otherwise visible within the clipping plane would not be affected by the changes made by the user. For example, going back to the earlier example, by creating the clipping plane around the fire sprinkler drop, the user could select a point of interest around the fire sprinkler drop, change components of the drop, shorten or lengthen it, etc., and not have those changes affect anything not shown within the clipping plane at the time and not intended to be changed by the user.

Each alert (conflict) bubble could then be assigned to a specific trade and colored, as appropriate, to a specific color designated to that trade (for example as illustrated in FIG. 16, which illustrates user definable trade and trade color configuration 330). Multiple alert bubbles could be used to represent the same conflict when the conflict involves more than one trade. For example, steel trade conflicts could be dark grey, with HVAC conflicts light grey, plumbing conflicts dark blue, electrical conflicts yellow, fire sprinkler conflicts orange, and other trades in various colors.

Figure 15:
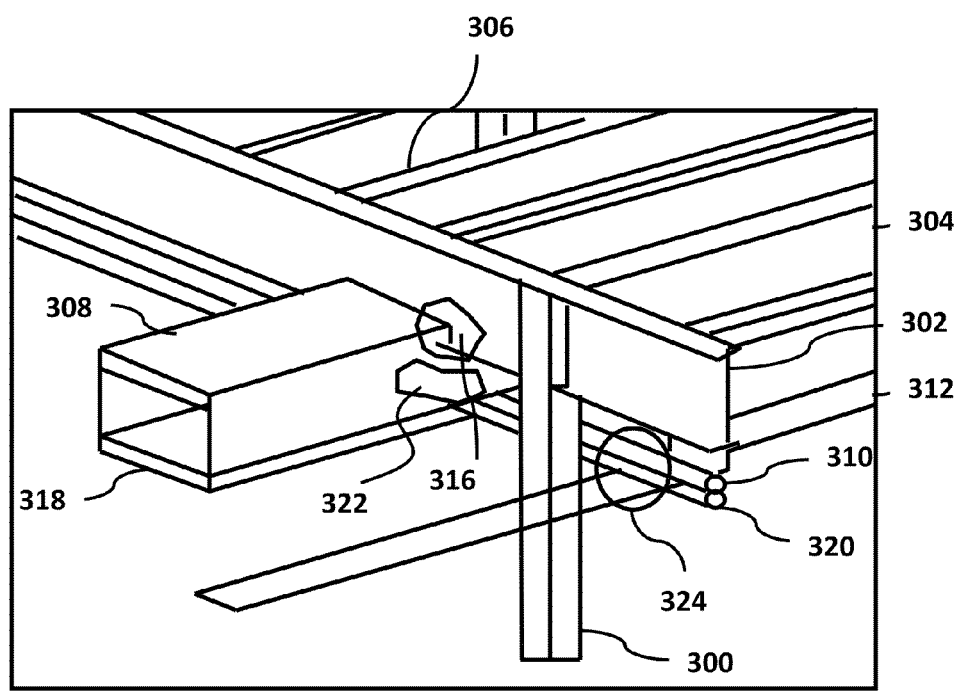
FIG. 15 is an illustration of a three dimensional drawing illustrating alert bubbles and reflections in accordance with the present invention.

FIG. 15 shows a portion of a building design including column 300, beams 302, 304 and 306, HVAC duct 308, pipe 310 and wiring cable tray 312, as well as a set of alert bubbles. The alert bubbles illustrate the various stages of the conflict resolution process for a number of different objects depicted in FIG. 15. For example, alert bubble 316 depicts a conflict between duct 308 and beam 302. Alert bubble 316 is assigned to the HVAC designer and colored accordingly. To resolve this conflict, the HVAC designer would need to move duct 308 and pipe 310 down along the y-axis by a conflict/interference distance identified by the alert bubble 316. The reflections 318 and 320 depict the new proposed positions of the duct 308 and pipe 310, respectively. Reflections are discussed in greater detail below. Since moving the duct 308 to reflected position 318 and pipe 310 to reflected position 320 would resolve the conflict, a resolution/alert bubble 322 is created (and colored differently) to depict the proposed resolution. However, since this proposed resolution would create a new conflict between the reflection 320 and the cable tray 312, an additional alert bubble 324 is created to reflect the new conflict.

Obviously, conflicts could be identified with alert bubbles using many different color schemes or even identified in many other ways, such as with different shaped alerts (other than bubbles), text associated with each alert, etc., and different identifying schemes could be employed in different industries, such as civil engineering, aeronautics, automotive, etc. Alerts/alert bubbles could also be identified based on other factors, such as the level of importance associated with the conflict, or all of these factors (trade, importance, etc.) could be combined into a single identification scheme.

Figure 17:
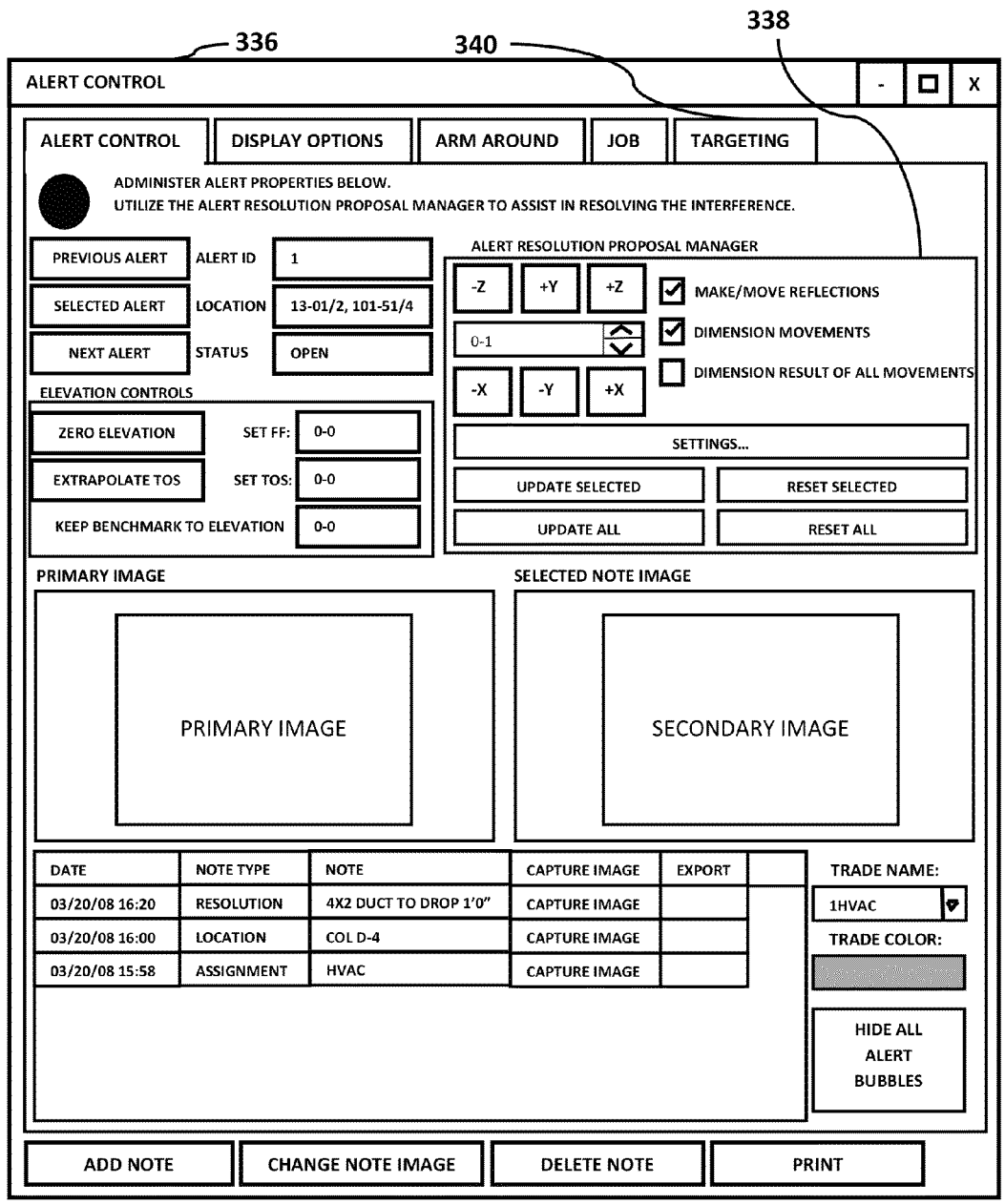
FIG. 17 is an illustration of an alert control utility in accordance with the present invention.

In addition to identifying a factor associated with a conflict, each alert bubble is associated with detailed information regarding the conflict it represents. Each alert bubble has a corresponding Alert Control dialog box 336, as illustrated in FIG. 17 that would be opened when the alert bubble was selected, and that includes an identification of the alert (conflict ID), the exact location of the conflict, the status of the conflict (i.e., whether or not it had been resolved), the date the conflict was created, the trade involved, the trade contractor responsible for the object involved in the conflict, images illustrating the conflict from one or more angles and resolutions, various notes associated with the alert, and resolution information. The ability to add any number of detailed notes to an alert bubble is of particular value because it gives each user of the system the ability to provide (and to receive) additional details and explanations regarding a conflict, such as why it occurred or was necessary, or even how it could be resolved without creating other conflicts. All notes and resolution tags, as well as vertical, horizontal, top of steel and finish floor dimensions are logged and can be printed along with full color screen shots illustrating the alert bubbles.

Most importantly, all of this detailed information for an alert bubble can be attached to and exported with that alert bubble for import into each trades' design drawing, regardless of the CAD format they are using. Thus, voluminous copies of the drawings including the conflict depictions do not need to be sent. Likewise, neither do fly-through movies of the drawings with the conflicts depicted need to be sent, nor do text based descriptions of where the conflicts are located. As illustrated in FIG. 16, the user can select exactly what information is to be attached and exported by checking the appropriate boxes in the Export Options section 332. This information includes different types of notes, various dimensions, different types of alert labels, alert and/or resolution bubbles, and additional comments, which can be included by typing them into the Export Tag area 334. As noted, either an alert bubble can be sent, or a resolution bubble, or both.

If an alert bubble is sent, it would typically be in the appropriate trade color, and would include its resolution location and the x-, y-, z-coordinates that track from conflict to resolution, so the trade designer can see where the conflict was and how it is proposed to be resolved. If both an alert bubble and a resolution bubble are sent, such as alert bubble 320 and resolution bubble 322 of FIG. 15, the alert bubble is placed at the point of conflict and the resolution is placed at the point of proposed resolution, with a line drawn between the two that includes the x-, y-, z-coordinates for the resolution distance.

This enables all of the alert bubbles to be sent to the other designers, or only those alert bubbles that are relevant to each designer. When the designers import these alert bubbles into their design drawings, the alert bubbles appear in either 2D or 3D space (as desired by the designer) with each of the colored bubbles positioned at the exact locations of the conflicts/resolutions. The designers can then begin the process of resolving the conflicts represented by each bubble, utilizing the detailed information contained in each alert (or resolution) bubble. If the user decides to export all alert bubbles, each trade can easily ascertain the alert bubbles pertaining to his particular trade by the color of the alert bubble assigned to his trade of company.

Figure 18:
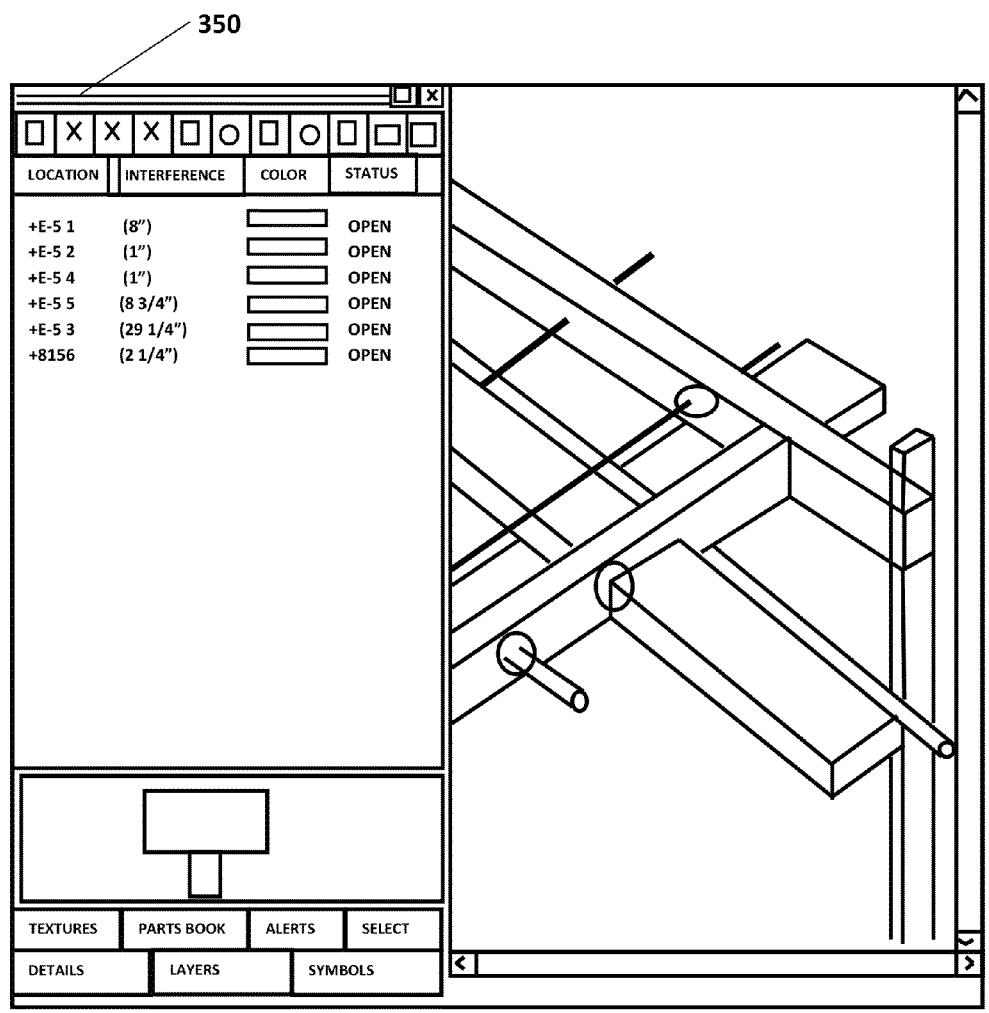
FIG. 18 is an illustration of a parts tree in accordance with the present invention.

Alert bubbles can also be selected and accessed remotely (outside of the drawing), as well as by the system parts tree 350 illustrated in FIG. 18. The parts tree 350 keeps a live record of actions taken on each alert/conflict and records location (that can also be used as the conflict ID), interference/conflict distance, color (as noted above, an alert bubble may start out red, then change to an appropriate color when assigned to a particular trade, and turn green when resolved), and status (either open or resolved when closed). Clicking on any alert in the parts tree 350 will cause the program to zoom to the corresponding alert in the main drawing.

The resolution of conflicts is also significantly improved through the use of reflections of conflicted elements and resolution bubbles. A reflection can take two forms. One is an exact translucent/transparent replica of an object that is created upon the initial movement of the object during the conflict resolution process and allows the user to view the affect of any proposed change. As illustrated in FIG. 17, Alert Control dialog box 336 includes an Alert Resolution Proposal Manager 338 that allows the user to test different possible resolutions of the conflict by moving different objects before actually making any permanent changes to the drawing. For more exacting control, and to determine precise clearance tolerances, the Alert Control dialog box 336 includes a Targeting tab 340 that opens a targeting screen 360, illustrated in FIG. 19, that offers several thorough solutions to the conflict, discussed in further detail below.

When an object or element is moved using the controls of the targeting screen 360 in an effort to resolve a conflict, an exact, real-time, transparent replica or "reflection" of the conflicted element is displayed. For example, as illustrated in FIG. 15, when the HVAC duct 308 and pipe 310 are moved down in order to avoid the conflict with beam 302, a duct reflection 318 and pipe reflection 320 are created. Since pipe reflection 320 would create a new conflict with cable tray 312, pipe 310 will need to be moved further (perhaps below the cable tray 312) to completely clear the conflict using this form of reflection.

The other type of reflection is an altered shape, real-time transparent replica of the conflicted element. The term "altered shape" in this context means that the height, width, length, some combination of those three dimensions, or some other shape of the element, has been changed in an attempt to resolve the conflict. For example, if HVAC duct 308 was four feet wide and two feet high and conflicted with beam 302 by four inches, rather than attempt to move duct 308 down (and thereby creating a conflict with pipe 310, it may have made more sense to change the shape of duct 308 to avoid the conflict with the beam 302. For example, if it was possible to reduce the height of duct 308 by six inches, perhaps by increasing its width to six feet, the conflict with the beam 302 would have been avoided without moving pipe 310, assuming increasing the width of duct 308 by two feet did not create another hard to resolve conflict elsewhere. Alert Resolution Proposal Manager 338 permits the user to test an altered shape reflection.

As previously indicated, the resolution bubble 322 represents the proposed resolution of the conflict represented by alert bubble 316, but two bubbles need not be used to achieve the same effect. For example, resolution bubble 322 need not be used. Rather, the single alert bubble 316 could be moved from its original position to the proposed resolution position, and turned green automatically when the conflict has been cleared by the movement. Alternatively, alert bubble 316 could be maintained in its original position, but turn green automatically when the proposed resolution clears the conflict, and then include information about the change in distance required to clear the conflict it represents. Obviously, many other types of arrangements could also be possible.

The graphic illustration of the objects, the conflicts, the conflict distances, and the reflections enable the user to see that the conflicts defined by the duct reflection 318 and the pipe reflection 320 can only be completely cleared by moving the pipe 310 below the cable/wiring tray 312, so as to create sufficient room for the duct 308 to be moved below the beam 302. Of course, if any of these proposed resolutions created conflicts elsewhere in the drawing, those conflicts would be identified as well and proposals would be created for their resolution. The process of trying different resolutions and identifying new potential conflicts would continue until a set of proposed resolutions could be defined that would clear all of the conflicts without creating new ones that could not be resolved.

The conflict identification and resolution features of the present invention are powerful new tools in complex CAD system design. In the past, each designer would be required to look at their conflicts in the drawing and make changes without knowing whether those changes created other conflicts with other trades. All of the designers' changes would then be incorporated into the main drawing, all of the new conflicts would again be identified, and the process would start all over. As a result, each of the designers might be required to go through numerous revisions and coordination meetings with the other designers in attempts to clear all of the conflicts. With the tools and features of the present invention, all current and possible future conflicts can be resolved during a single conflict resolution coordination meeting.

Figure 19:
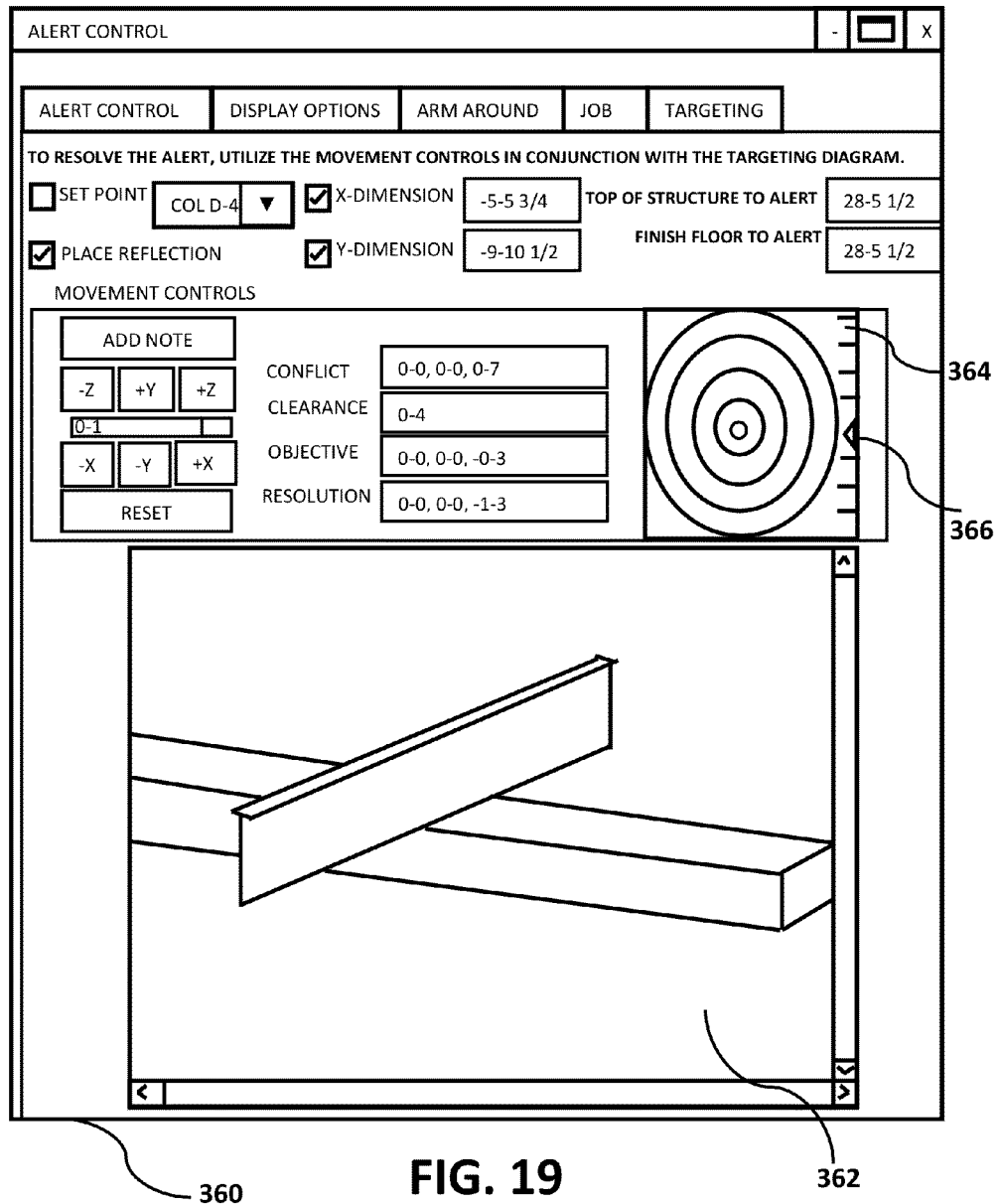
FIG. 19 is an illustration of the targeting features of the alert control utility of FIG. 17 in accordance with the present invention.

One of the more powerful tools represented by the Alert Resolution Proposal Manager 338 of FIG. 17 and the targeting screen 360 of FIG. 19 is the user's ability to input a clearance distance amount as an "objective" to achieve a resolution. With respect to Manager 338, this clearance amount can be input as a distance along either direction of the X-, Y- or Z-axes, can be based on the dimensional units used in the drawing, can include reflections of the objects being moved, and can include dimensional results of any movement. This clearance distance can also be structured to include any added distance needed to accommodate insulation, framing materials or anything else, thereby providing a very practical end result.

With respect to targeting screen 360 of FIG. 19, the movement controls can be used in conjunction with the targeting diagram to achieve very accurate results. In particular, targeting screen 360 includes the ability to create an exact replica of the conflicted items in a separate modeless drawing 362 that allows the user to view the conflict separate and apart from the clutter of the other objects in the "base" drawing. Being modeless, the user can move, zoom in or out or rotate the view separate and apart from the base drawing as well. Targeting screen 360 reports the specific conflict dimensionally and offers a resolution coordinate, including any user specified clearance amount, and as noted works in conjunction with "target" 364 and a number of colored arrows 366 to indicate the point of conflict, the resolution, and the current conflicted element's location. Naturally, a different type of target and differently shaped arrows or other elements could be used in place of the items shown to guide the user toward a conflict resolution, and still achieve the same result.

Figure 22:
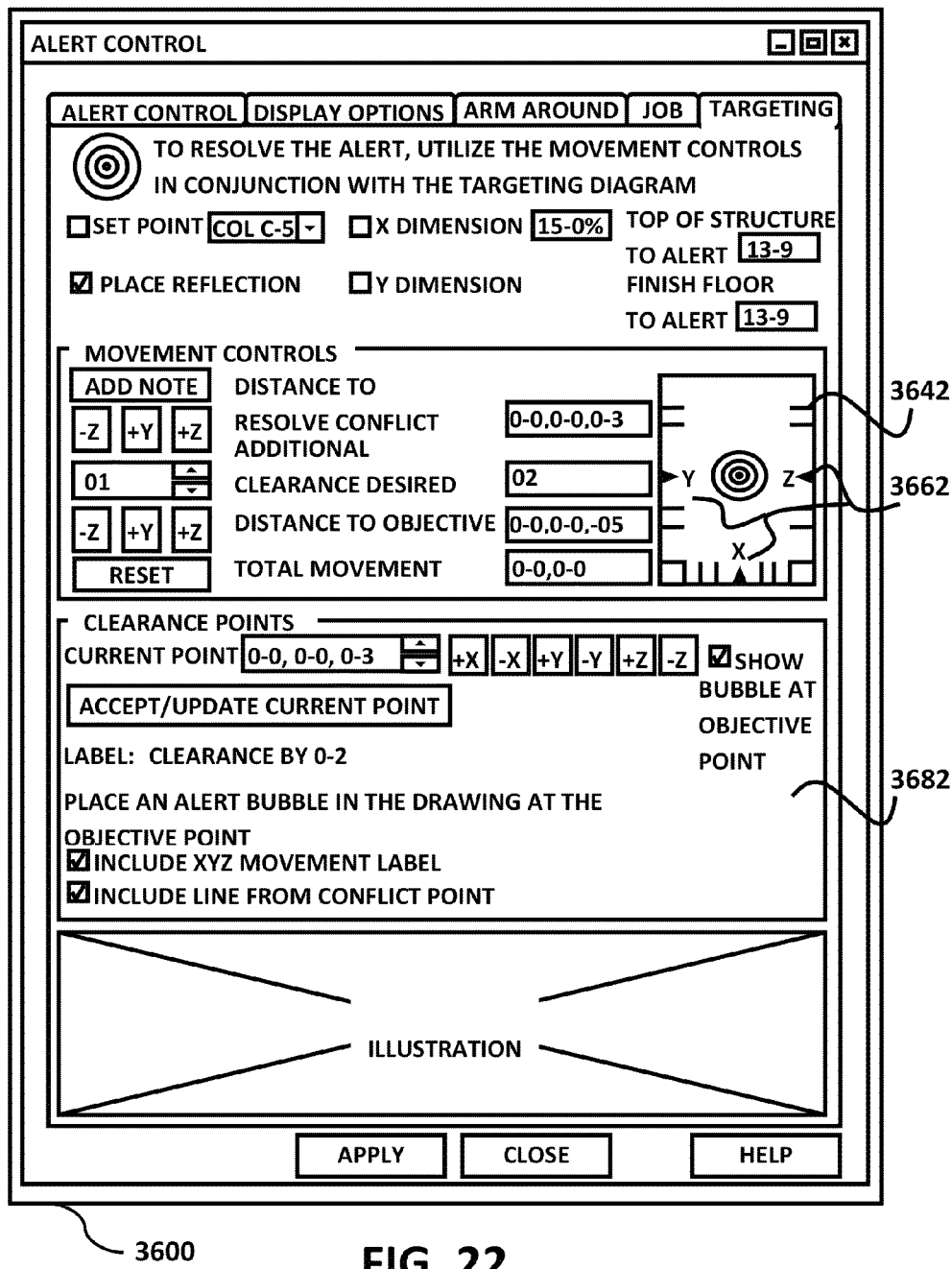
FIG. 22 is an illustration of an alert control utility with an alternate targeting feature in accordance with the present invention.

FIG. 22 illustrates an alternate version of the targeting screen 360 shown in FIG. 19. In FIG. 19 as noted above, the targeting screen reports the specific conflict dimensionally and offers a resolution coordinate, including any user specified clearance amount working in conjunction with target 364 and a number of colored arrows 366 to indicate the point of conflict, the resolution, and the current conflicted element's location. In FIG. 22, an alternate version of targeting screen 360 is shown as targeting screen 3600. Targeting screen 3600 provides many of the same features as targeting screen 360, but further provides the three-dimensional target diagram 3642 with arrows 3662 for the X, Y and Z axes, which provides the user with a convenient three-dimensional visualization of movements input through the movement controller along the three axes. The arrows 3662 can be different colors to help distinguish them from each other.

Targeting screen 3602 also provides a clearance point section 3682 that allows the user to manually set clearance points or distances from the current point of a selected object in either direction along the X, Y and Z axes. The user can accept and update the current point to the clearance points selected. In addition, the user can elect to have an alert or conflict bubble drawn or shown at the objective point (the proposed new location), and elect to label that bubble with the X, Y and/or Z movement that occurred to get to the objective point, and elect to draw or show a line from the conflict point to the objective point.

To further enhance the system of the present invention's ability to identify and resolve all conflicts in as few meetings as possible, the system includes a dynamic collaboration function that enables multiple users in remote locations to simultaneously and dynamically locate and resolve in realtime all conflicts within a drawing in 3D space. The collaboration manager operates in conjunction with Alert Control 330 of FIG. 16 and has access to the same functions and detailed information related to all conflicts within the drawing, including all of the alert bubbles and their associated data, and the movement controls and features of the Alert Resolution Proposal Manager 338 FIG. 17 and the targeting screen 360 of FIG. 19. Each of the users, communicating over the Internet or another data network (and telephonically as well), would access the collaboration manager and have access to a list of all alert (clash or conflict) IDs. A list of all clashes/conflicts between two trades (i.e., electrical versus plumbing) would also be made available.

When a user selected a conflict from either list, all of the users would be directed to that conflict. The view they would receive would be determined by a virtual camera placed in a position above the problem area. The virtual camera would be angled to the coordinates of the conflict, with the area of interference in focus. An alert bubble would be placed at the conflict to direct the attention of the users to that area. Given bandwidth constraints on the network, it may not be practical to have all of the users simultaneously sharing access to the same system and its visual displays. Thus, one user may be given control of the collaboration manager and the main system while all of the other users operate local systems and receive the coordinates for conflicts over the network so they can be maneuvered to the same location and the same time.

The user with control over the collaboration manager would have access to its features as well as the features and options illustrated in FIGS. 16-19 with respect to conflict identification and resolution. The user would be provided with specifics about a conflict, its layer within the drawing, its coordinates, notes/comments, etc., as well as images of the conflict. The movement controls would then be used to move conflicted objects, as needed to resolve conflicts, and to meet other needs. The other users would be able to view the movement of the objects, any reflections that were created, any changes to the alert bubbles, any new alert bubbles, etc. Users would also be able to see the separate modeless drawing 362 when necessary to help understand and resolve a conflict.

When a user of the collaboration manager accepted responsibility for moving an object in order to resolve a conflict, any action taken by this user would be recorded to a master file that would be available to the central coordinator of the design project. The information recorded (gathered from the user's configuration files) would include the project, the contractor, the conflict, the individuals involved in resolving the conflict, an image of the conflict area, coordinates, a description of the conflict, and other useful information. Alternatively, a request for information could be generated to an appropriate user that specifies the action that is required of the user to reach a resolution. Comments could be recorded and attached to the alert bubble(s). The project coordinator will then have access to the file containing all of this information and the ability to review that information in a number of different formats, such as SQL, Excel or a text file.

As previously noted, in the context of the building industry, just about every trade is required to work within and around the frame of the building when doing their designs. The structural units making up the frame must be located accurately in order for a designer to plan HVAC ducting, plumbing layouts, wiring/cable trays, electrical chases, fire sprinkler lines, etc., which all must be built within the building's frame system. In addition, the framing members provide high strength anchor and bracing points, so a designer would want to be able to take advantage of these points while preparing their design. In most structural drawings, however, the beam and column lines are all included on a single layer and are either just plain lines or are custom or AEC objects—rarely are the beams or columns displayed as actual 3D objects (and when they are, they are often drawn in specialized drawing systems that require additional conversion and viewing tools to use and view, and which may not be available to the user in question).

In the event any beams or columns are in the form of custom objects within a drawing, the system of the present invention can extract the data that defines the custom objects (effectively grabbing the geometric data defining the object) and use that data to automatically create 3D objects of the beams/columns. This process is most easily carried out when the user of the present system has loaded proper object enablers for the custom objects. An object enabler is software that can be used to access, display and manipulate object data in applications that are different from the one used to create those objects. If the object enablers are not available or accessible, however, the present system can search for the base point from which an object was created (a common x, y, z) and use that information to create a 3D version of that object.

The beam and column utilities of the system of the present invention provide users with the ability to automatically produce an accurate 3D model of a building frame from 2D line drawings so that designers can quickly and easily locate the primary points of the frame concerned with their trade. These utilities can be used in conjunction with the automatic roof plane and wall features of the system of the present invention, which interconnects columns to the top of any exterior walls to emulate the building's actual roof pitch, and which adds beams/joists at specific elevations or along the established roof planes, so as to enable a user to design in objects that need to be hung from the roof or beams/joists.

Figure 20:
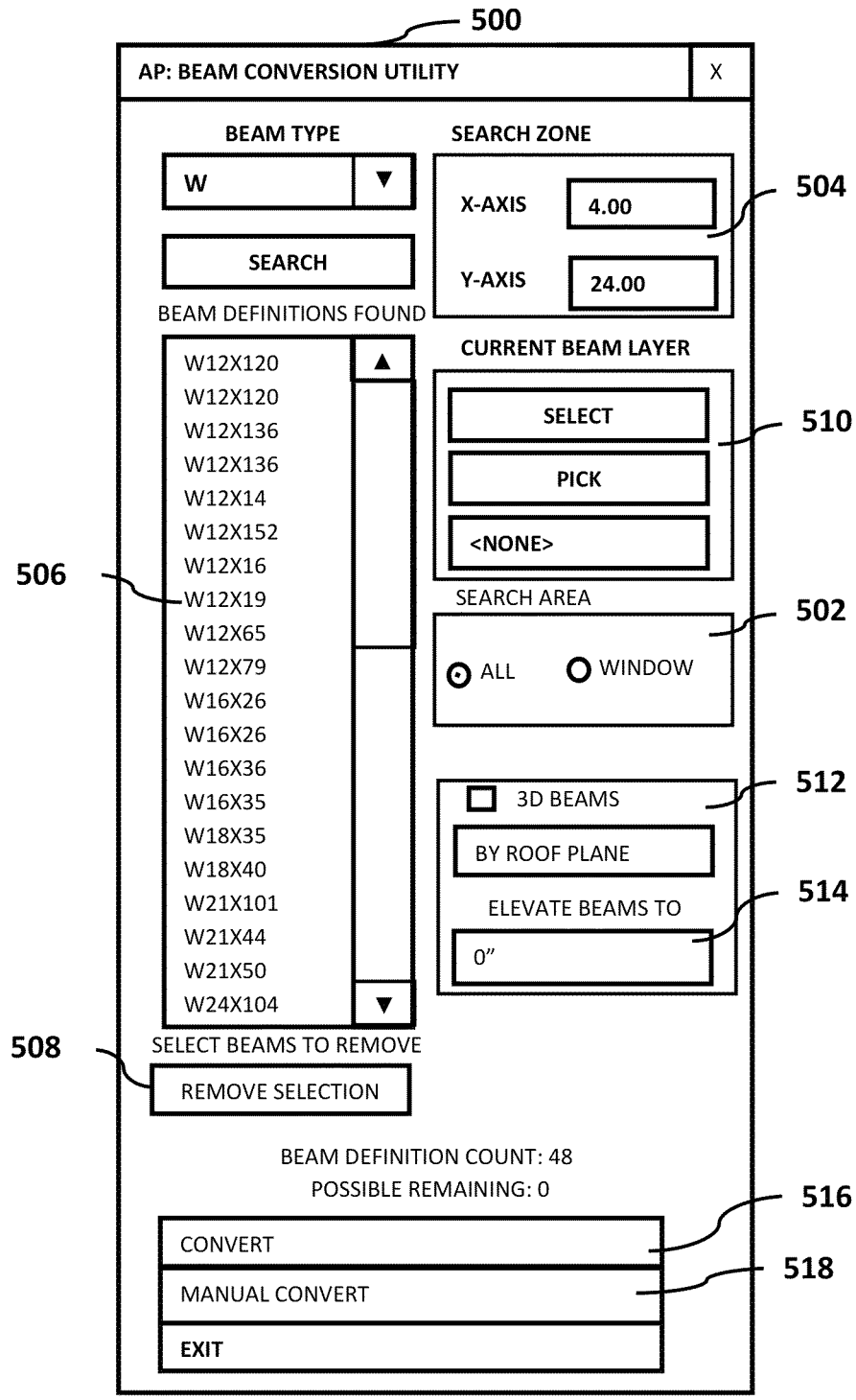
FIG. 20 is an illustration of a beam conversion utility in accordance with the present invention.

The Beam Conversion Utility, illustrated by dialog box 500 of FIG. 20, gives users the ability to modify lines that define horizontal structural members, such as beams and joists (referred to generally as "beams"), as well as metal and wood composition and other attributes. When structural designers use a third party routine to generate lines in a drawing defining a structural member, the routines place a line at the desired location and then place a block with attributes for the line nearby (called an attribute label block). These attributes, some hidden and some visible, contain information (typically in Mtext format) about the structural member.

The Beam Conversion Utility collects all of the attribute labels, breaks them down into simple text (removing Unicode), and reads the text to gather information about the beams. To aid the system in finding all of the desired attribute block labels and beam lines, the user can instruct the system to search the entire drawing file or to search just a window selected by the user as defined by Search Area 502. The user can also define a Search Zone 504, which is the rectangular area away from an attribute label block that the system will search (when gathering the beam lines in a drawing) for a beam line that corresponds to that attribute label block.

When beams and their attributes are found, the user can select a particular beam type and all of the beams meeting that type definition will then be listed in Beam Definitions Found window 506. There are many different beam types, but some of the most commonly used include the following:

Steel Beam Types
   W
   S
   M
   HP
   C
   MC
   WT
   ST
   MT
   Single Angle
   Double Angle
   Rectangular HSS
   Round HSS
Steel Joist Girder Types
   G
   VG
   BG
Steel Joist Types
   PARALLEL CHORDS UNDERSLUNG
   PARALLEL CHORD SQUARE ENDS
   TOP CHORD SINGLE PITCHED UNDERSLUNG
   TOP CHORD DOUBLE PITCHED SQUARE ENDS
   TOP CHORD OFFSET DOUBLE PITCHED UNDERSLUNG
   TOP CHORD OFFSET DOUBLE PITCHED SQUARE ENDS
   TOP CHORD SINGLE PITCHED SQUARE ENDS
   TOP CHORD DOUBLE PITCHED UNDERSLUNG
   GABLED JOIST
   BOWSTRING JOIST
Wood Joist Types
   TJL
   TJLX
   TJW
   TJS
   TJM
   TJH It is important to list all of the beams that fit each type so the user can make a choice as to which beams should be used to create the 3D structure. Certain types and sizes of beams may not be useful to certain trades for identifying anchor and brace points, so there is no need to spend computing resources and time drawing 3D representations of those beams. The Remove Selection button 508 enables the user to remove any beams that are not desired to be drawn in 3D.

The Current Beam Layer 510 is then used to select a layer within the current drawing where the lines representing all of the selected beams are to be placed. The user has two options, to select a layer from a pop-up dialog box that lists all of the layers of the current drawing, or to pick an object on the desired layer where the lines should be placed. Once a layer is selected, the user then has a number of conversion options. Selecting the "3d Beams" box in the Conversion Options 512 transforms each beam into the actual shape defined by the beam type letter (W, TJL, G, etc.) in the Beam Definitions Found window 506. Selecting the Roof Plane option enables the user to assign elevations (in window 514) to each point of the roof plane and to then elevate, in 3D or 2D line form, to the angle of the defined roof plane. The window 514 is designed to use the TOS (Top Of Steel) format, with the top flange or lineal angle of the beam (perpendicular to the Z-axis) as the highest point.

The Beam Definition Count represents the number of beams listed in the Beam Definitions Found 506. The Possible Remaining number represents the total number of lines representing beams in the search area (all or window). The Convert button 516 causes the system to proceed with the beam conversion process, applying the option criteria selected by the user, placing the beams in the layer defined by the user, and drawing the beams based on the beam type letter. The Manual Convert button 518 is available when the Possible Remaining number is greater than "0" and when selected, directs the user to a dialog box that zooms to and highlights selected beams within the drawing so the user can convert any beams that might have been missed by the Convert routine 516. A beam might be missed and not converted when the text defining the beam is missing, a beam line is outside of the search zone, or there is a break in the line representing a single beam.

Figure 21:
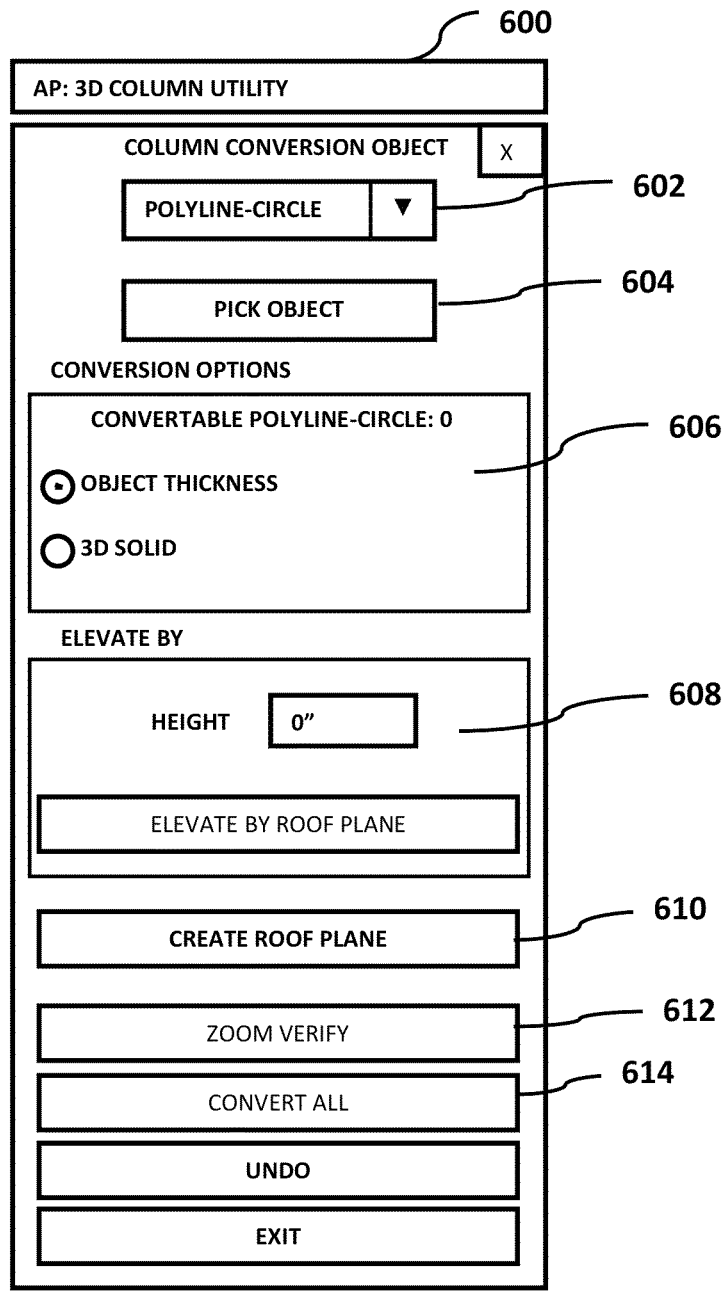
FIG. 21 is an illustration of a 3D column utility in accordance with the present invention.

The 3D Column Utility illustrated by dialog box 600 of FIG. 21, gives users the ability to modify objects that represent structural columns in a 2D drawing. As with beams, structural designers will typically use a third party routine to generate lines, polylines or circles that represent a column in 2D, or lines with attribute label blocks that includes the column size, shape and length (height), or use defined structural members. Not only will the 3D Column Utility search for the appropriate representations and use the information found to transform the 2D representations or definitions into 3D columns, the 3D Column Utility will use any column height information found for a column in an attribute label block to automatically build a column of the proper height based on that information. The Column Utility will also shape columns to match one of the common shapes used in the construction industry for steel columns when the drawing database is vague with respect to shape information.

When the columns in a drawing are formed from polylines and circles, the Column Conversion Object window 602 utilizes existing polylines or circles that define a column's shape and prompts the user to select a polyline shape (closed, or origin and endpoints match) for the column. The system then searches the drawing database for the same shape on the same layer and prepares these shapes for 3D conversion. The Pick Object button 604 prompts the user to select an existing polyline or circle (pre-drawn by a structural designer) representing a column. When the selection is made, the system will then search the drawing database for objects meeting the same properties of the selected object. When objects meeting the search criteria of the selected object are found, the total number is listed in the Conversion Options section 606. The Conversion Options section also gives the user the option of using thickness property of the drawing CAD system to modify the height of the object or to create 3D solids based on the object's shape and the required height.

An embodiment of the present invention provides a method that establishes a roof plane by reading the text, attributes and/or other definitions for a support object in a drawing, such as a column or a wall; creating automatically a three dimensional representation of the object based on that information about the object; placing the object in an exact location that is defined by the centerline of the object and the centerline of the intersection, or any other information that is relevant for exactly locating the object; entering the height of the object automatically from the information about the object, or alternatively, having the information manually entered; repeating the aforementioned steps for as many number of objects present in the drawing, or necessary for the establishment of a roof plane. Once all the objects have been established, a roof plane is established that is on top of the objects.

Alternatively, a roof plane can by established by the Elevate By section 608, which provides the user the option of entering a desired height for the column, which is then assigned to all of the selected objects, or elevating the columns to the roof plane, if there is one and if it is directly above the selected objects. The user can also create a roof plane by selecting Create Roof Plane button 610. When selected, the user is prompted to pick the points representing the roof. The height or elevation is then entered for each point picked and the roof place is created utilizing the picked points and elevations. The Zoom Verify button 612 will cause the system to visually zoom to the column found by the search from the Pick Object option 604. Once there, the user is prompted to verify conversion of that object. The Convert All option 614 converts all of the gripped objects utilizing the options selected.

When blocks are used to define columns, the system will search the drawing for blocks (user defined or dynamic) that contain column definitions. The definitions in the blocks are then converted to columns utilizing the data in these blocks that define the columns. To extract this data, which is usually in multi-text form, the Unicode will be stripped out to create simple text that can then be read. As with the beam utility, the attribute label blocks are usually located near the objects representing the columns. The system will therefore search for previously used definitions and attributes that may contain column information. When a possible column is found, the user will be prompted to select the attribute containing the information required to transform the column to 3D. When structural members are identified in the drawing using industry standard labels, the labels will be read and automatically converted to appropriate columns.

An embodiment of the present invention makes it possible for the user to create three-dimensional representations of objects in a drawing while only using two-dimensional drawing objects. Many users find it difficult to visualize and draw objects in three-dimensions in three-dimensional drawing programs, but the same users are very comfortable drawing in two-dimensions. By allowing the user to draw in two-dimensions and to have the drawing objects automatically converted to three-dimensional objects within the same drawing, the user can anticipate and more easily visualize and create the desired three-dimensional images. This effectively enables the user to draw in three-dimensions while actually drawing in two-dimensions.

Furthermore, in certain embodiments, the systems and methods described herein can advantageously be implemented using computer software, hardware, firmware, or any combination of software, hardware and firmware. In certain embodiments, systems are implemented as a number of software modules that comprise computer executable code for performing the functions described herein. In certain embodiments, the computer-executable code is executed on one or more general purpose computers. However, a skilled artisan will appreciate, in light of this disclosure, that any module that can be implemented using software to be executed on a general purpose computer can also be implemented using a different combination of hardware, software or firmware. For example, such a module can be implemented completely in hardware using a combination of integrated circuits. Alternatively or additionally, such a module can be implemented completely or partially using specialized computers designed to perform the particular functions described herein rather than by general purpose computers.

Moreover, certain embodiments of the invention are described with reference to methods, apparatus (systems) and computer program products that can be implemented by computer program instructions. These computer program instructions can be provided to a processor of a general purpose computer, special purpose computer, or other programmable data processing apparatus to produce a machine, such that the instructions, which execute via the processor of the computer or other programmable data processing apparatus, create means for implementing the acts specified herein to transform data from a first state to a second state.

These computer program instructions can be stored in a computer-readable memory that can direct a computer or other programmable data processing apparatus to operate in a particular manner, such that the instructions stored in the computer-readable memory produce an article of manufacture including instruction means which implement the acts specified herein.

The computer program instructions may also be loaded onto a computer or other programmable data processing apparatus to cause a series of operational steps to be performed on the computer or other programmable apparatus to produce a computer implemented process such that the instructions that execute on the computer or other programmable apparatus provide steps for implementing the acts specified herein.

While certain embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A non-transitory computer readable storage medium comprising instructions that, when executed on a computing device, cause the computing device to at least:
   identify a visual conflict between a first three-dimensional graphic object having a first visual location displayed within a drawing within a display of a computer system and one or more other three-dimensional graphic objects having one or more second visual locations displayed within the drawing, the visual conflict resulting from the first visual location sharing a portion of, up to all of, the one or more second visual locations;
   identify a proposed new visual location of the first three-dimensional graphic object, the proposed new visual location being within the drawing and resolving the visual conflict between the first three-dimensional graphic object and the one or more other three-dimensional graphic objects;
   create a copy of the first three-dimensional graphic object, the copy being within the drawing and depicting the first three-dimensional graphic object as the first three-dimensional graphic object appears at the proposed new visual location without moving the first three-dimensional graphic object from the first visual location;
   determine whether the proposed new visual location clears the visual conflict by not sharing a portion of the one or more second visual locations; and
   in the event the proposed new visual location clears the visual conflict, move the first three-dimensional graphic object from the first visual location to the proposed new visual location and delete the copy.

2. The non-transitory computer readable storage medium as recited in claim 1, wherein the copy is an exact, translucent depiction of at least the first three-dimensional graphic object.

3. The non-transitory computer readable storage medium as recited in claim 1, wherein the copy is an altered, translucent depiction of at least the first three-dimensional graphic object.

4. The non-transitory computer readable storage medium as recited in claim 3, wherein the altered, translucent depiction provides a modified dimension or shape compared to an original dimension or shape of at least the first three-dimensional graphic object, and where the proposed new visual location is based on the modified dimension or shape.

5. The non-transitory computer readable storage medium as recited in claim 1, wherein the instructions further cause the computing device to at least:
create a three-dimensional resolution graphic object at a visual conflict location in the drawing, the visual conflict location being near where the first visual location shares the portion of, up to all of, the one or more second visual locations; and
deleted the three-dimensional resolution graphic object when the proposed new visual location is determined not to share a portion of the one or more second visual locations.

6. The non-transitory computer readable storage medium as recited in claim 1, wherein the instructions further cause the computing device to at least:
create a three-dimensional resolution graphic object at a visual conflict location in the drawing, the visual conflict location being near where the first visual location shares the portion of, up to all of, the one or more second visual locations, where the three-dimensional resolution graphic object is a translucent bubble having a first color;
move the three-dimensional resolution graphic object from the visual conflict location to a non-conflict visual location near the proposed new visual location when the proposed new visual location is determined to clear the conflict; and
change the first color of the translucent bubble to a second color.

7. The non-transitory computer readable storage medium as recited in claim 1, wherein the instructions further cause the computing device to at least:
create a three-dimensional resolution graphic object at a visual conflict location in the drawing, the visual conflict location being near where the first visual location shares the portion of, up to all of, the one or more second visual locations, wherein the three-dimensional resolution graphic object is a translucent bubble having a first color; and
change the first color of the translucent bubble to a second color if the proposed new visual location is determined to clear the conflict.

8. The non-transitory computer readable storage medium as recited in claim 1, wherein the instruction to identify a proposed new visual location includes an instruction to receive from a user one or more objective distances for moving the copy of the first three-dimensional graphic object from the first visual location to the new visual location.

9. The non-transitory computer readable storage medium as recited in claim 8, wherein the one or more objective distances include a first distance to resolve the visual conflict and a first additional distance along a first axis, a second distance to resolve the visual conflict and a second additional distance along a second axis, and a third distance to resolve the visual conflict and a third additional distance along a third axis, wherein the instruction to receive includes an instruction to display to the user within the display a targeting screen including a movement controller and a targeting diagram, the movement controller providing the user with manual inputs for setting the first distance, the first additional distance, the second distance, the second additional distance, the third distance and the third additional distance, the targeting diagram providing a visual illustration of the manual inputs along the first axis, the second axis and the third axis.

10. The non-transitory computer readable storage medium as recited in claim 9, wherein the instructions further cause the computing device to at least display an alert bubble within the drawing at the proposed new location that indicates the one or more objective distances.

11. The non-transitory computer readable storage medium as recited in claim 10, wherein the first three dimensional graphic object has a visual conflict location in the drawing near where the first visual location shares the portion of, up to all of, the one or more second visual locations, further comprising the step of displaying a line from the visual conflict location to the alert bubble.

12. The non-transitory computer readable storage medium as recited in claim 1, wherein the instructions further cause the computing device to at least provide a modeless drawing window within the display that depicts an exact replica of an area of the drawing around the visual conflict, wherein the area around the visual conflict depicted within the modeless drawing window can be viewed and moved by a user within the modeless drawing window independent of the drawing.

13. The non-transitory computer readable storage medium as recited in claim 12, wherein the user can change a magnification of the area around the visual conflict depicted within the modeless drawing window independent of the drawing.

14. The non-transitory computer readable storage medium as recited in claim 12, wherein the instruction to identify a proposed new visual location includes an instruction to receive from a user one or more objective distances for moving the first three-dimensional graphic object from the first visual location to the new visual location, and wherein the one or more objective distances include a first distance to resolve the visual conflict and a first additional distance along a first axis, a second distance to resolve the visual conflict and a second additional distance along a second axis, and a third distance to resolve the visual conflict and a third additional distance along a third axis, wherein the step of receiving includes the step of displaying to the user a targeting screen within the display including a movement controller and a targeting diagram, the movement controller providing the user with manual inputs for setting the first distance, the first additional distance, the second distance, the second additional distance, the third distance and the third additional distance, the targeting diagram providing a visual illustration of the manual inputs along the first axis, the second axis and the third axis.

15. The non-transitory computer readable storage medium as recited in claim 1, wherein the instructions further cause the computing device to at least provide a modeless drawing within the display that represents at least a portion of an area surrounding the first three-dimensional graphic object and the one or more other three-dimensional graphic objects, wherein the modeless drawing can be viewed from one or more angles and at one or more magnifications.

16. The non-transitory computer readable storage medium as recited in claim 15, wherein the instructions further cause the computing device to at least move a representation of at least the first three-dimensional graphic object depicted within the modeless drawing from the first visual location to the proposed new visual location according to one or more objective distances along one or more axes provided by a user.

17. The non-transitory computer readable storage medium as recited in claim 1, wherein the drawing includes a plurality of three-dimensional graphic objects, further comprising the step of providing a clipping plane within the drawing that allows a user to select a bounded area within the drawing to view and edit one or more three-dimensional graphic objects among the plurality of three-dimensional graphic objects within the bounded area, wherein only the one or more three-dimensional graphic objects visible within the bounded area can be edited by the user and no edit made within the bounded area affects any three-dimensional graphic objects among the plurality of three-dimensional graphic objects not visible within the bounded area.

18. The non-transitory computer readable storage medium as recited in claim 17, wherein the instructions further cause the computing device to at least:
select a point of interest within the drawing;
place the bounded area around the point of interest;
contract and expand the bounded area around the point of interest until the bounded area contains only a set of one or more three-dimensional graphic objects among the plurality of three-dimensional graphic objects that the user wants to edit; and
edit the set of one or more three-dimensional graphic objects.

19. The non-transitory computer readable storage medium as recited in claim 18, wherein the instructions further cause the computing device to at least contract and expand includes the step of providing the user with a click on and drag slider.

20. The non-transitory computer readable storage medium as recited in claim 18, wherein the instructions further cause the computing device to at least place includes the step of centering the bounded area on the point of interest.

21. The non-transitory computer readable storage medium as recited in claim 18, wherein the instructions further cause the computing device to at least center the drawing visible to the user on the point of interest.

22. The non-transitory computer readable storage medium as recited in claim 20, wherein the instructions further cause the computing device to at least lock a position of the point of interest.

23. The non-transitory computer readable storage medium as recited in claim 1, wherein the instructions further cause the computing device to at least identify a proposed new visual location includes an instruction to provide one or more remote users with access to the drawing and permit the one or more remote users to collaboratively determine the proposed new visual location.

24. The non-transitory computer readable storage medium as recited in claim 23, wherein the instructions further cause the computing device to at least identify a proposed new visual location further includes the step of receiving one or more objective distances provided by the one or more remote users and using the one or more objective distances to determine the proposed new visual location, and wherein the one or more objective distances include a first distance to resolve the visual conflict and a first additional distance along a first axis, a second distance to resolve the visual conflict and a second additional distance along a second axis, and a third distance to resolve the visual conflict and a third additional distance along a third axis, wherein the step of receiving includes the step of displaying to the one or more remote users a targeting screen within the display including a movement controller and a targeting diagram, the movement controller providing the one or more remote users with manual inputs for setting the first distance, the first additional distance, the second distance, the second additional distance, the third distance and the third additional distance, the targeting diagram providing a visual illustration of the manual inputs along the first axis, the second axis and the third axis.

25. A non-transitory computer readable storage medium comprising instructions for proposing a resolution to a graphical position conflict between a first three-dimensional graphic object and a second three-dimensional graphic object displayed within a drawing within a display of a computer system, the instructions when executed on the computer system, cause the computer system to perform the steps of:
identifying a set of coordinates for a proposed new graphical location of either the first three-dimensional graphic object or the second three-dimensional graphic object, the proposed new graphical location resolving the graphical position conflict between the first three-dimensional graphic object and the second three-dimensional graphic, including the steps of receiving one or more objective distances provided by a user and using the one or more objective distances to determine the proposed new graphical location; and
creating a replica of either the first three-dimensional graphic object or the second three-dimensional graphic object at the proposed new graphical location without moving the first three-dimensional graphic object or the second three-dimensional graphic object, the replica being within the drawing and illustrating how the first three-dimensional graphic object or the second three-dimensional graphic object looks at the proposed new graphical location.

26. The non-transitory computer readable storage medium as recited in claim 25, further comprising instructions that, when executed on the computer system, cause the computer system to further perform the steps of:
creating an alert bubble within the drawing near an area of the graphical position conflict; and
associating a label with the alert bubble indicating the one or more objective distances.

27. The non-transitory computer readable storage medium as recited in claim 26, further comprising instructions that, when executed on the computer system, cause the computer system to further perform the step of creating a line in the drawing from the graphical position conflict to the alert bubble.

28. The non-transitory computer readable storage medium as recited in claim 25, wherein the one or more objective distances include a first distance to resolve the graphical position conflict and a first additional distance along a first axis, a second distance to resolve the graphical position conflict and a second additional distance along a second axis, and a third distance to resolve the graphical position conflict and a third additional distance along a third axis, wherein the step of receiving includes the step of displaying to the user a targeting screen within the drawing including a movement controller and a targeting diagram, the movement controller providing the user with manual inputs for setting the first distance, the first additional distance, the second distance, the second additional distance, the third distance and the third additional distance, the targeting diagram providing a visual illustration of the manual inputs along the first axis, the second axis and the third axis.

29. The non-transitory computer readable storage medium as recited in claim 28, further comprising instructions that, when executed on the computer system, cause the computer system to further perform the step of providing a modeless drawing window within the display that depicts an exact replica of an area around the graphical position conflict, wherein the area around the graphical position conflict depicted within the modeless drawing can be viewed and moved by the user within the modeless drawing window independent of the drawing.

30. The non-transitory computer readable storage medium as recited in claim 29, wherein the user can change a magnification of the area around the graphical position conflict depicted within the modeless drawing window independent of the drawing.

31. The non-transitory computer readable storage medium as recited in claim 29, wherein the modeless drawing includes at least a portion of the first three-dimensional graphic object and at least a portion of the second three-dimensional graphic object, and wherein the first three-dimensional graphic object or second three-dimensional graphic object depicted in the modeless drawing window is moved based on the one or more objective distances to illustrate how the first three-dimensional graphic object or the second three-dimensional graphic object would appear in the proposed new graphical location.

32. A computing device comprising a memory bearing instructions configured for proposing a resolution to a graphical position conflict between a first three-dimensional graphic object and a second three-dimensional graphic object displayed within a drawing within a display of a computer system, the instructions when executed on the computing device, cause the computing device to at least perform the steps of:
identifying a set of coordinates for a proposed new graphical location of either the first three-dimensional graphic object or the second three-dimensional graphic object, the proposed new graphical location being within the drawing and resolving the graphical position conflict between the first three-dimensional graphic object and the second three-dimensional graphic object, including the steps of receiving one or more objective values provided by a user and necessary to resolve the graphical position conflict and using the one or more objective values to determine the proposed new graphical location;
providing a modeless drawing within the display that represents an area around the graphical position conflict and includes at least a portion of the first three-dimensional graphic object and at least a portion of the second three-dimensional graphic object, wherein the modeless drawing is viewed from one or more angles and at one or more magnifications; and
creating and displaying in the modeless drawing a replica of either the first three-dimensional graphic object or the second three-dimensional graphic object at the proposed new graphical location without moving the first three-dimensional graphic object or the second three-dimensional graphic object, the replica illustrating how the first three-dimensional graphic object or the second three-dimensional graphic object looks at the proposed new graphical location.

33. The computing device as recited in claim 32, wherein the instructions, when executed on the computing device, further cause the computing device to perform the step of moving the first three-dimensional graphic object depicted within the modeless drawing from an existing graphical location to the proposed new graphical location according to one or more objective values.

34. A non-transitory computer readable storage medium comprising instructions for proposing a resolution to a graphical position conflict between a first three-dimensional graphic object and a second three-dimensional graphic object displayed within a drawing within a display of a computer system that, when executed on a computing device, cause the computing device to at least:
identify a set of coordinates for a proposed new graphical location of either the first three-dimensional graphic object or the second three-dimensional graphic object, the proposed new graphical location being within the drawing and resolving the graphical position conflict between the first three-dimensional graphic object and the second three-dimensional graphic object, including the steps of receiving one or more objective values provided by a user and using the one or more objective values to determine the proposed new graphical location;
provide a clipping plane within the display that allows the user to select a bounded area within the drawing to view an area of the drawing around the graphical position conflict without editing any graphic object displayed in the drawing not depicted within the area; and
create and display in a modeless drawing a replica displayed within the display of either the first three-dimensional graphic object or the second three-dimensional graphic object at the proposed new graphical location without moving the first three-dimensional graphic object or the second three-dimensional graphic object, the replica illustrating how the first three-dimensional graphic object or the second three-dimensional graphic object looks at the proposed new graphical location.

35. The non-transitory computer readable storage medium as recited in claim 34, wherein the instructions further cause the computing device to at least:
select a point of interest within the area;
place and center the bounded area on and around the point of interest;
contract and expand the bounded area around the point of interest in response to a user initiated movement of a slider displayed to the user until the bounded area contains only one or more desired graphic objects that the user wants to edit; and
edit the one or more desired objects.

* * * * *